(12) United States Patent
Lin et al.

(10) Patent No.: US 11,380,769 B2
(45) Date of Patent: Jul. 5, 2022

(54) SELECT GATE SPACER FORMATION TO FACILITATE EMBEDDING OF SPLIT GATE FLASH MEMORY

(71) Applicant: Taiwan Semiconductor Manufacturing Co., Ltd., Hsin-Chu (TW)

(72) Inventors: Meng-Han Lin, Hsinchu (TW); Chih-Ren Hsieh, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/589,358

(22) Filed: Oct. 1, 2019

(65) Prior Publication Data
US 2021/0098586 A1    Apr. 1, 2021

(51) Int. Cl.
*H01L 29/423* (2006.01)
*H01L 29/788* (2006.01)
*H01L 29/66* (2006.01)
*H01L 27/11521* (2017.01)
*H01L 27/11526* (2017.01)
*H01L 21/3213* (2006.01)
*H01L 21/02* (2006.01)
*H01L 21/28* (2006.01)

(52) U.S. Cl.
CPC .. *H01L 29/42328* (2013.01); *H01L 21/02244* (2013.01); *H01L 21/32133* (2013.01); *H01L 21/32139* (2013.01); *H01L 27/11521* (2013.01); *H01L 27/11526* (2013.01); *H01L 29/40114* (2019.08); *H01L 29/66825* (2013.01); *H01L 29/7881* (2013.01)

(58) Field of Classification Search
CPC ......... H01L 29/42328; H01L 27/11526; H01L 29/7881; H01L 27/11521; H01L 21/32133; H01L 21/02244; H01L 29/40114; H01L 21/32139; H01L 29/66825
See application file for complete search history.

(56) References Cited

U.S. PATENT DOCUMENTS

| | | | |
|---|---|---|---|
| 9,812,460 B1* | 11/2017 | Wu | H01L 29/66545 |
| 10,325,919 B1* | 6/2019 | Teng | H01L 27/11524 |
| 10,937,794 B2* | 3/2021 | Zhou | H01L 27/11546 |
| 10,937,879 B2* | 3/2021 | Lin | H01L 29/42368 |
| 2008/0290401 A1 | 11/2008 | Yasui et al. | |
| 2013/0171785 A1 | 7/2013 | Shroff et al. | |
| 2017/0125432 A1* | 5/2017 | Richter | H01L 21/76283 |
| 2017/0345841 A1* | 11/2017 | Wu | H01L 29/66545 |

(Continued)

*Primary Examiner* — Victor A Mandala
(74) *Attorney, Agent, or Firm* — Eschweiler & Potashnik, LLC

(57) ABSTRACT

An integrated circuit device includes a semiconductor substrate having a memory area and a logic area. A memory cell in the memory area includes a select gate separated from a floating gate by a floating gate spacer. A select gate spacer is formed on a side of the select gate opposite the floating gate. The select gate spacer has a uniform thickness over most of the select gate. The first layer of the select gate spacer may be formed by oxidizing the select gate electrode. A second layer of the select gate spacer may be formed by atomic layer deposition. the memory area may be covered by a protective layer while spacers are formed adjacent logic gates in the logic region.

20 Claims, 16 Drawing Sheets

(56) References Cited

U.S. PATENT DOCUMENTS

| | | | |
|---|---|---|---|
| 2018/0012898 A1* | 1/2018 | Wu | H01L 29/42328 |
| 2018/0151579 A1* | 5/2018 | Liu | H01L 27/11526 |
| 2018/0151581 A1* | 5/2018 | Wu | H01L 27/11543 |
| 2018/0151707 A1* | 5/2018 | Wu | H01L 27/11548 |
| 2019/0165115 A1* | 5/2019 | Lin | H01L 29/42344 |
| 2020/0105777 A1* | 4/2020 | Lin | H01L 21/0337 |
| 2020/0161319 A1* | 5/2020 | Wu | H01L 29/42328 |
| 2020/0168701 A1* | 5/2020 | Lin | H01L 27/11519 |
| 2020/0227426 A1* | 7/2020 | Chuang | H01L 21/0337 |
| 2020/0381442 A1* | 12/2020 | Wu | H01L 27/11546 |
| 2021/0066327 A1* | 3/2021 | Lin | H01L 29/42328 |
| 2021/0091198 A1* | 3/2021 | Fang | H01L 21/0217 |

* cited by examiner

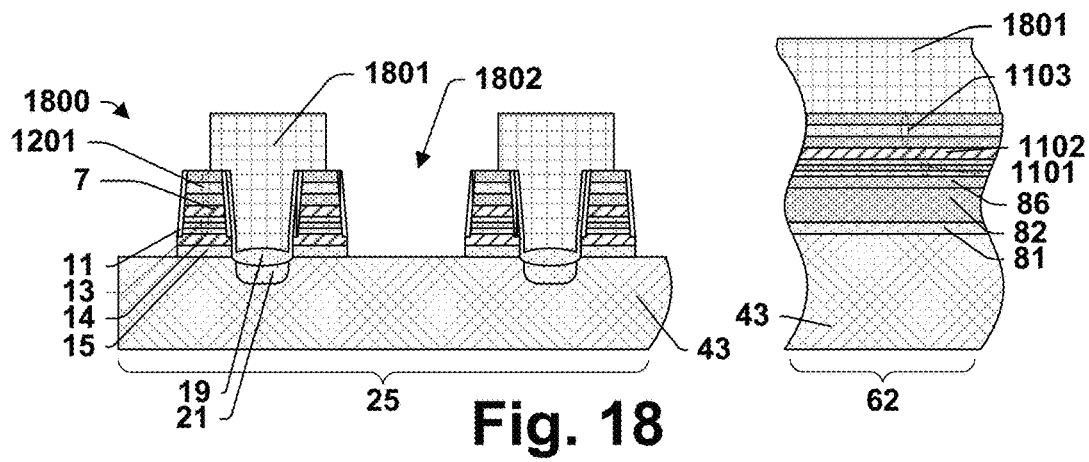
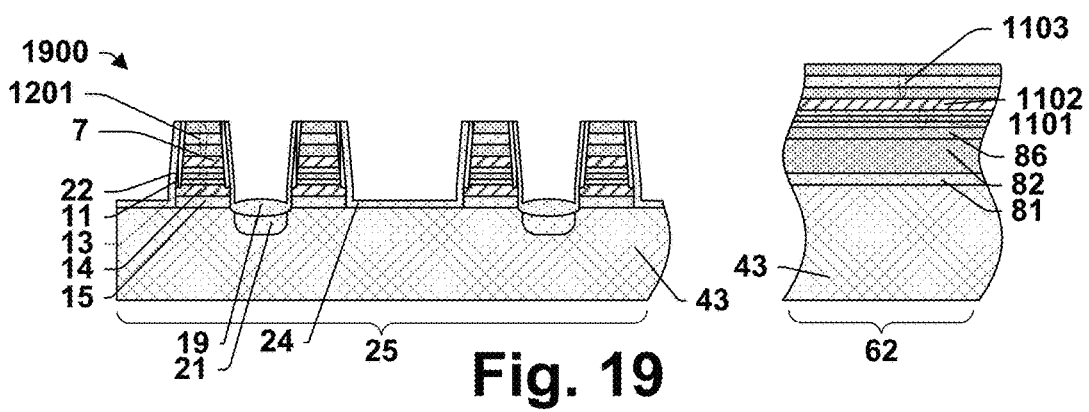
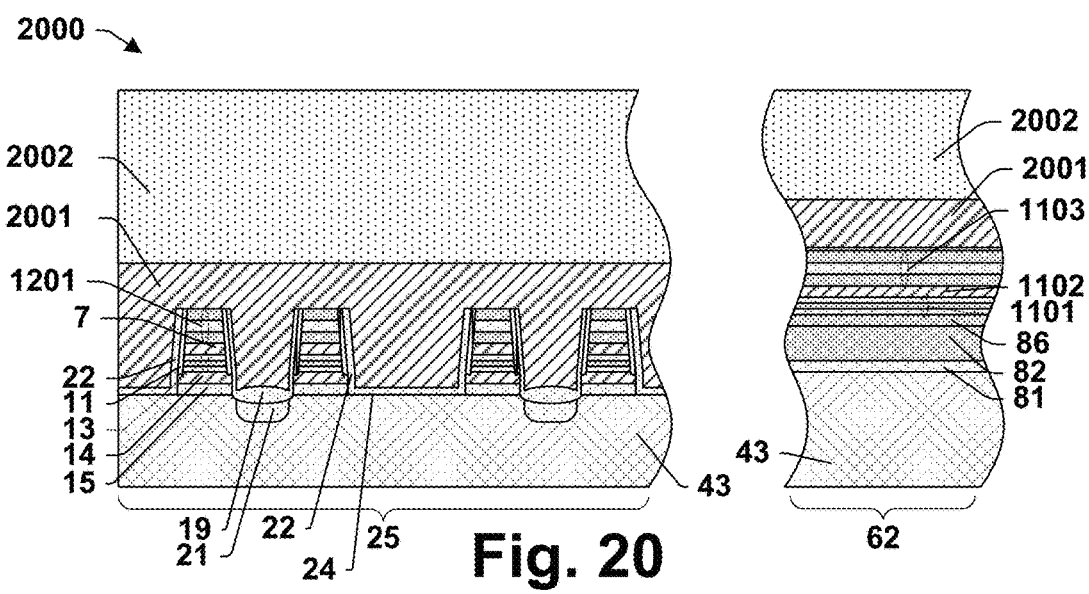

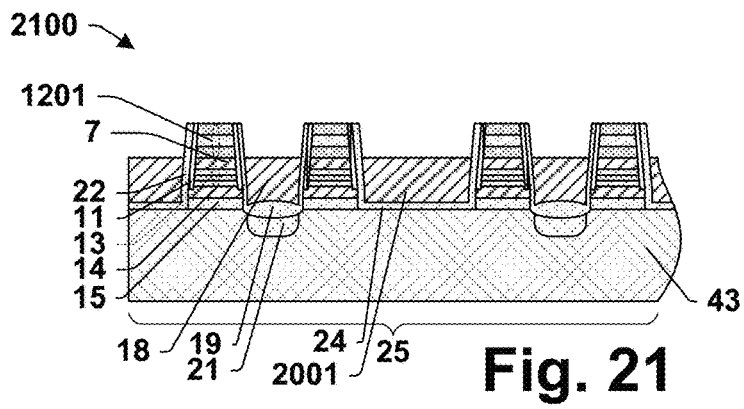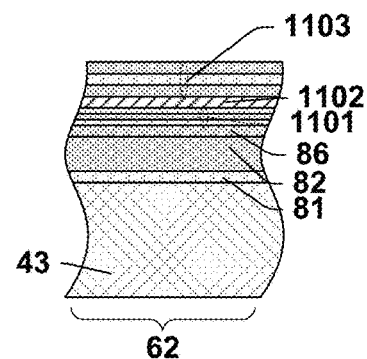
Fig. 21
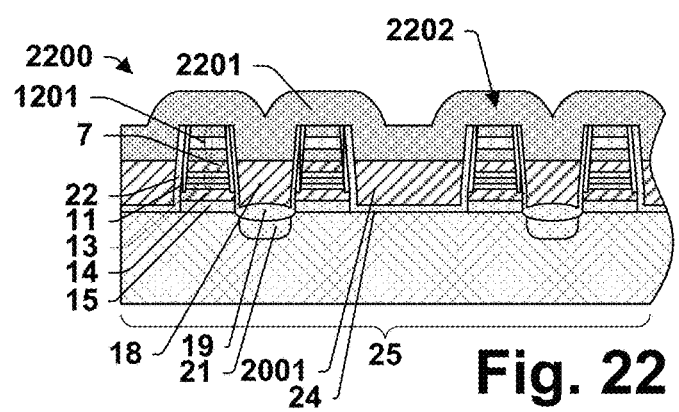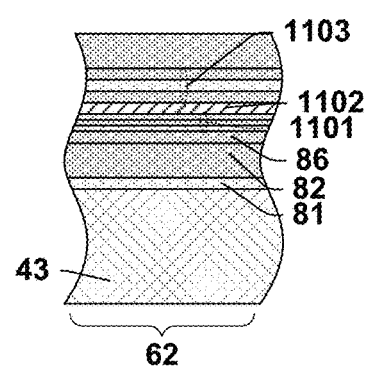
Fig. 22
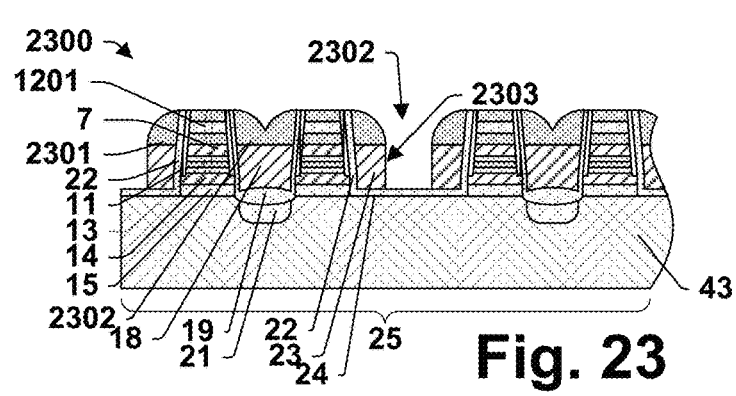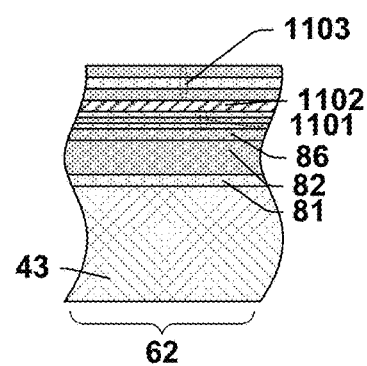
Fig. 23
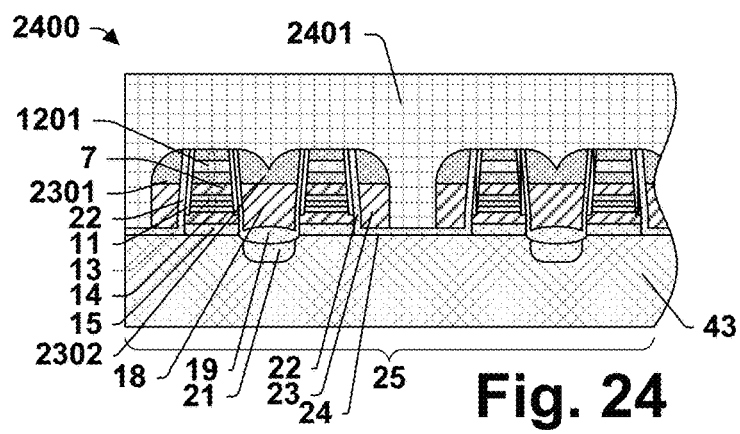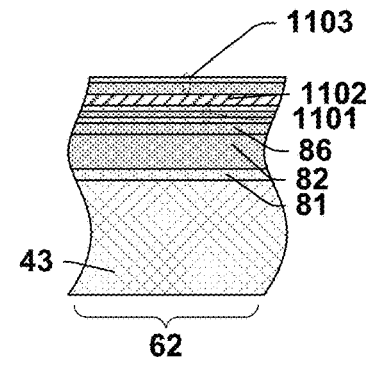
Fig. 24

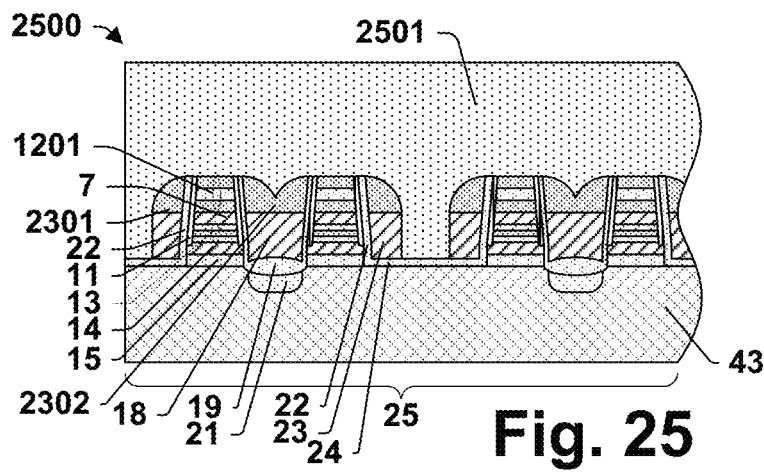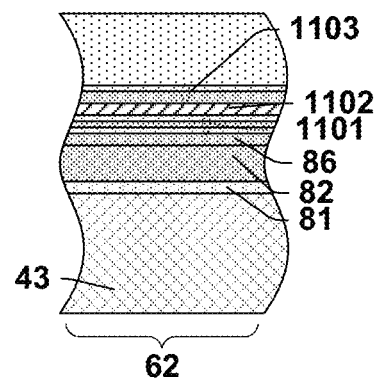
Fig. 25
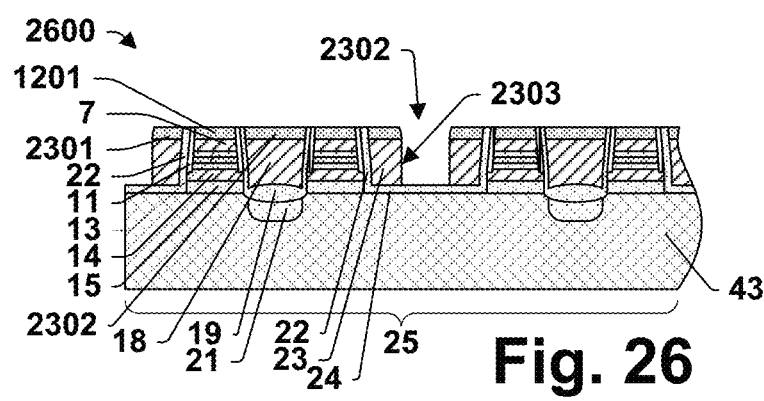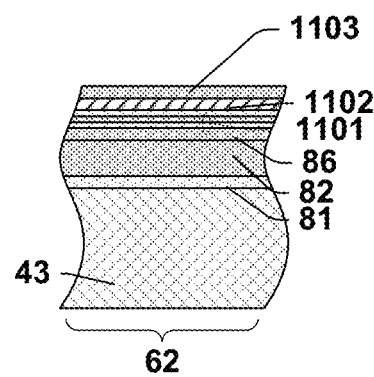
Fig. 26
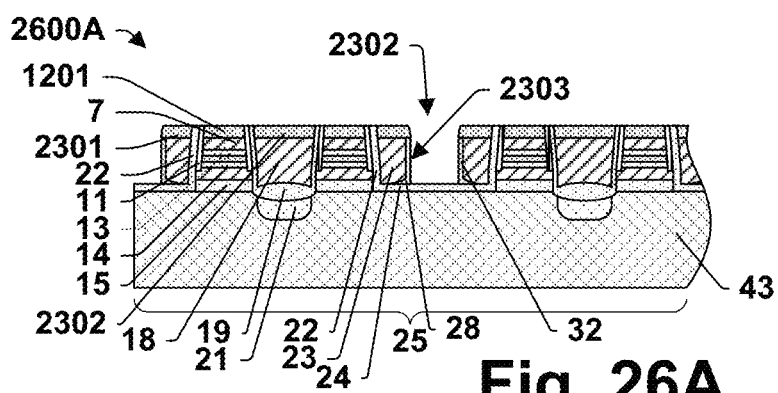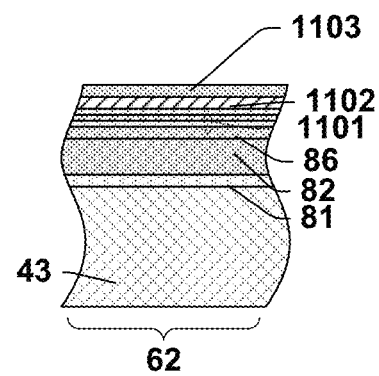
Fig. 26A

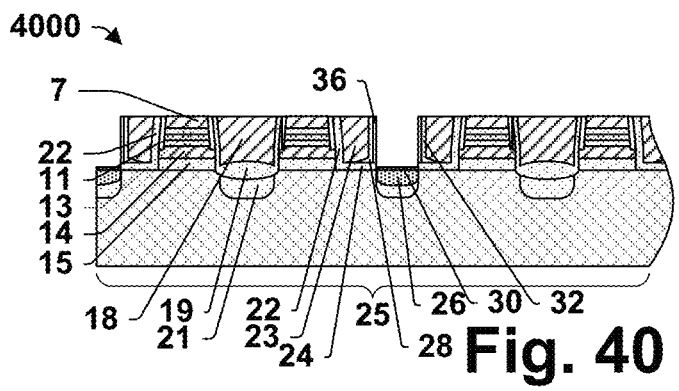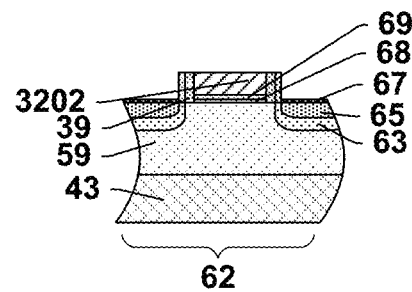
Fig. 40
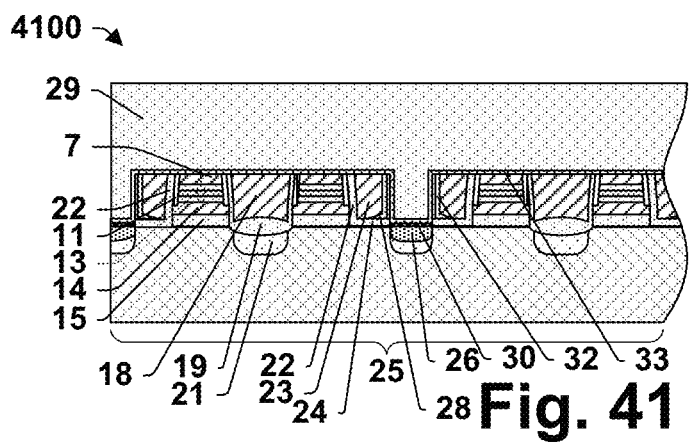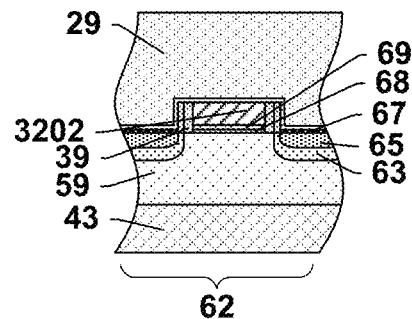
Fig. 41
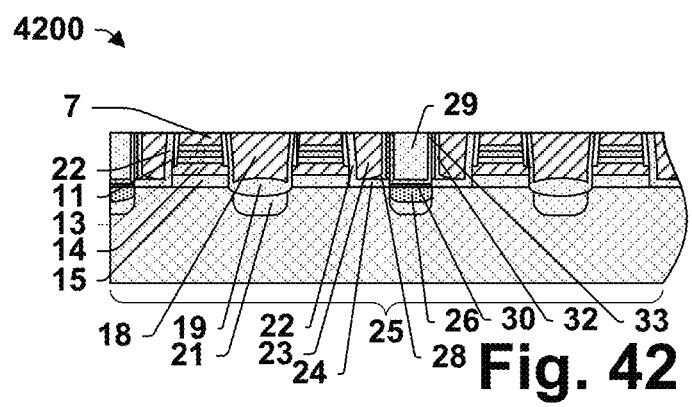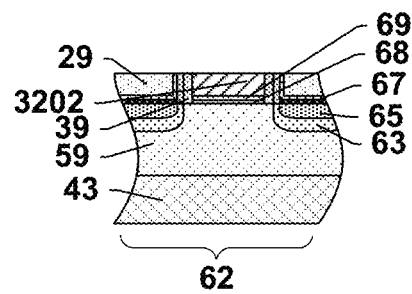
Fig. 42

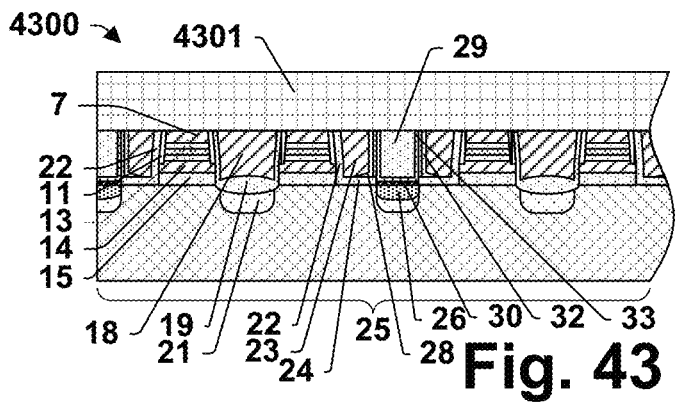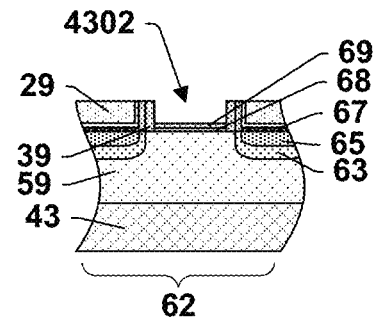
Fig. 43
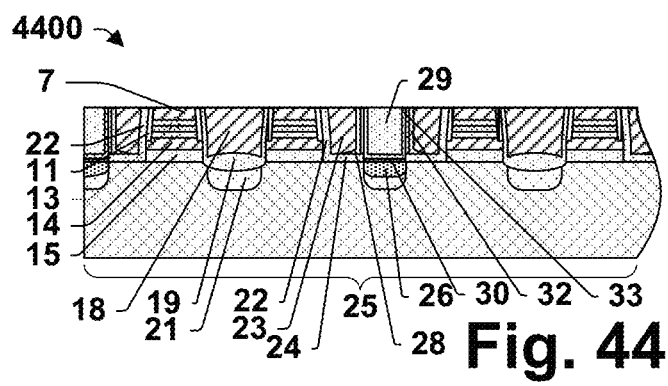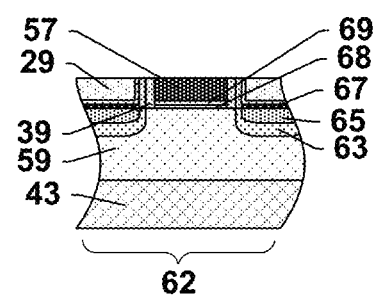
Fig. 44
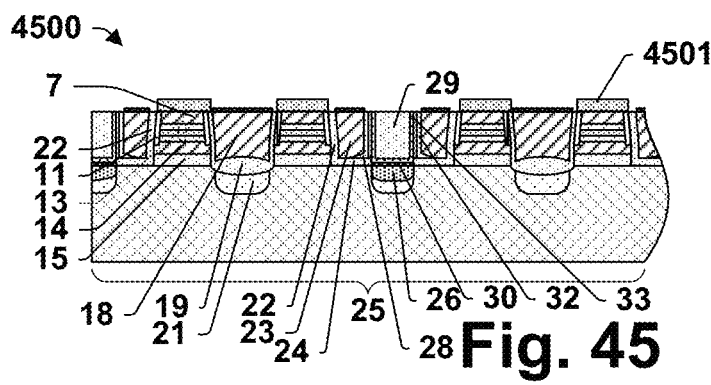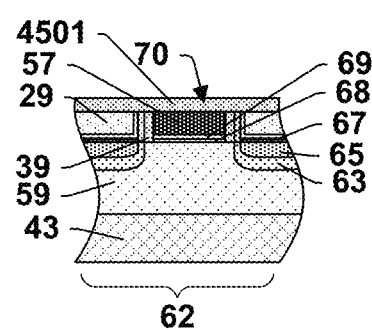
Fig. 45

SELECT GATE SPACER FORMATION TO FACILITATE EMBEDDING OF SPLIT GATE FLASH MEMORY

BACKGROUND

The integrated circuit (IC) manufacturing industry has experienced exponential growth over the last few decades. As ICs have evolved, functional density (i.e., the number of interconnected devices per chip area) has increased while feature sizes have decreased. Other advances have included the introduction of embedded memory technology and high-κ metal gate (HKMG) technology. Embedded memory technology is the integration of memory devices with logic devices on the same semiconductor chip. The memory devices support operation of the logic devices and improve performance in comparison to using separate chips for the different types of devices. High-κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

FIGS. 2-45 illustrate a series of cross-sectional views of an IC according to some aspects of the present disclosure undergoing a manufacturing process according to some aspects of the present disclosure.

DETAILED DESCRIPTION

Figure 1:
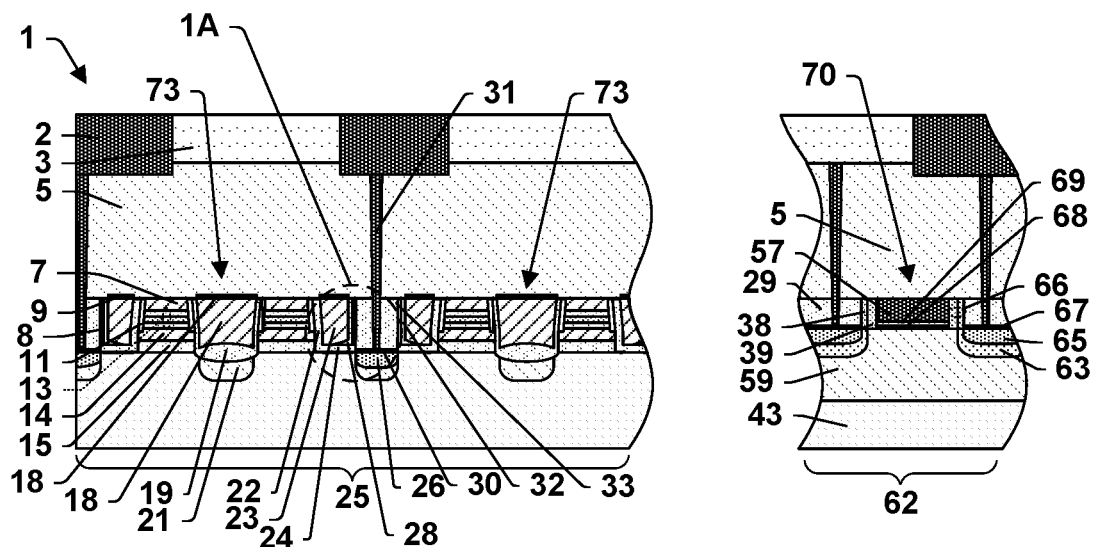
FIG. 1 illustrates a cross-sectional view of an integrated circuit (IC) according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

The present disclosure provides structures and manufacturing process for embedding split gate flash memory into an integrated circuit (IC) that includes logic gates. The IC includes split gate flash memory cells disposed on or over a semiconductor substrate in a memory region and logic device disposed on or over the substrate in a logic region. The logic devices may include address decoders and/or read write circuitry and/or microcontrollers and may control operation of the memory cells and/or perform other tasks. An isolation region with an isolation structure may separate the memory region from the logic region.

The memory cells may include control gates formed over floating gates. Due to this stacked arrangement, the memory cells may be taller than the logic devices. If the memory cells have the same pitch as the logic devices, the gaps between the memory cells will have a higher aspect ratio than the gaps between the logic devices. In some embodiments, the gaps between the memory cells may have a high aspect ratio in part as a result of being bounded by select gate electrodes formed adjacent floating gate/control gate stacks using a mask defined by a spacer patterning technique. The gaps may be further reduced when sidewall spacers are formed. Narrow gaps with high aspect ratio can make operations such as dielectric fill-in more difficult.

The present disclosure provides structures and method by which gaps between memory cells can be made larger without increasing pitch. According to the present disclosure, a significant portion of each select gate sidewall spacer is formed by oxidation of the select gate electrode. The oxidation process produces a first select gate sidewall spacer without substantially narrowing the gap between cells. The oxidation process may also increase a thickness of the select gate dielectric in a manner that makes the select gate dielectric thicker on an end distal the floating gate as compared to an end proximate the floating gate. This structure allows the select gate sidewall spacer to be made thinner without increasing gate-induced drain leakage.

A second select gate sidewall spacer may be formed by deposition. In some of the present teachings, the second select gate sidewall spacer is formed by atomic layer deposition (ALD). It is advantageous to allow a portion of the overall select gate sidewall spacer to be formed by deposition, in particular ALD deposition, because an oxide layer is routinely deposited over the entire memory region to provide an etch stop for removal of a protective layer that covers the memory region while logic gates are patterned. The second select gate sidewall spacer may be very thin. In some of these teachings, the select gate spacer formed by deposition is thinner than the select gate spacer formed by oxidation.

Both the re-oxidation process and ALD deposition process have the property of forming the sidewall spacer without reducing the verticality of the sidewalls that define the gaps between adjacent memory cells. These processes both tend to produce a sidewall spacer that is uniform in thickness. The uniformity is maintained over most of the select gate. Some thickening of the sidewall spacer may occur proximate the substrate due to oxidation taking place underneath the select gate spacer and having a particularly high rate at the corner where the side surface meets the bottom surface.

In the prior art, it was typical to remove the protective layer from the memory region before forming logic gate spacers. In some of the present teachings, the protective layer is not removed until after the logic gate spacers have been formed. This allows the select gate spacer to have a different composition from the logic gate spacers. In some of the present teachings, the logic gate spacers include a nitride layer but the select gate spacers do not. In some of the present teachings, the select gate spacers are thinner than the logic gate spacers.

FIG. 1 provides a cross-sectional view of selected portions of an IC device 1 according to some aspects of the present teachings. The portions include a portion of a memory region 25 and a portion of a logic region 62, both of which are formed on a substrate 43. Logic region 62 includes high-K metal gates 70, and memory region 25 includes split gate flash memory cells 73.

Split gate flash memory cells 73 include floating gate electrodes 14 separated from substrate 43 by floating gate dielectric 15, control gate electrodes 7 separated from floating gate electrodes 14 by control gate dielectric 13, erase gate electrodes 18 separated from substrate 43 by erase gate dielectric 19, and select gate electrodes 23 separated from substrate 43 by select gate dielectric structure 12. Control gate spacers 11 are formed to the sides of control gate electrodes 7. Floating gate sidewall spacers 22 are formed to the sides of floating gates electrodes 14. Floating gate sidewall spacers 22 separate floating gates electrodes 14 from select gate electrodes 23.

Figure 1A:
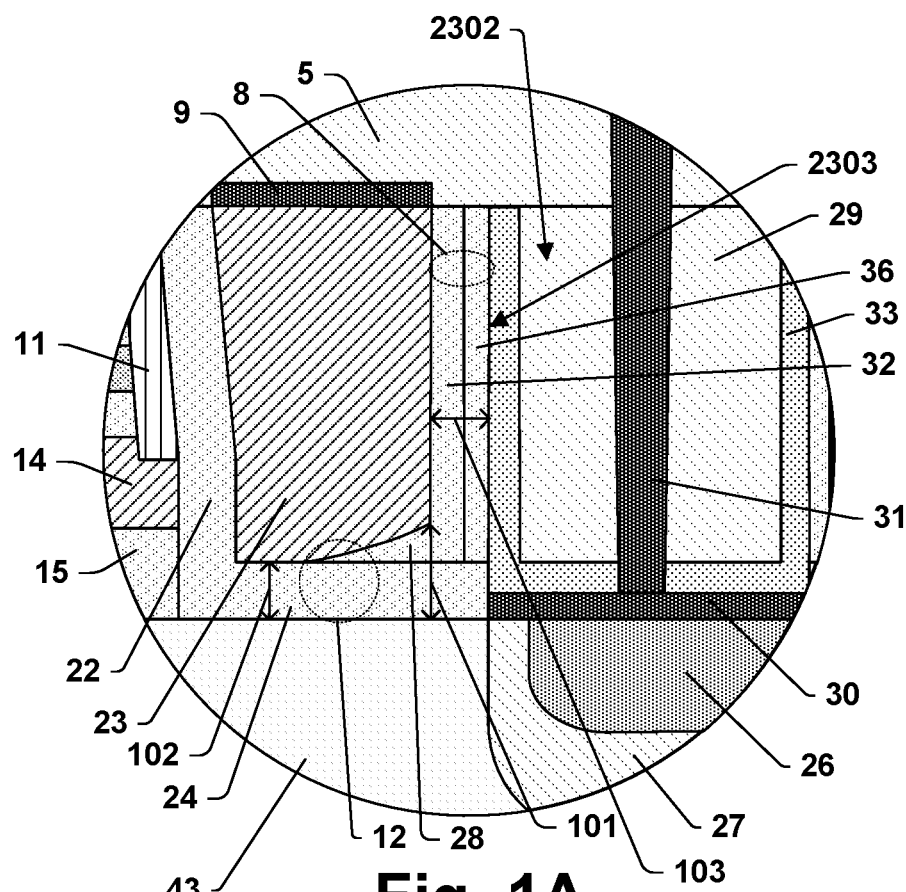
FIG. 1A illustrates is an enlarged view of area 1A of FIG. 1.

FIG. 1A provides an expanded view of the area 1A identified in FIG. 1. As more easily seen in FIG. 1A, a select gate spacer structure 8 is formed to a side of select gate electrode 23 that is opposite floating gate electrode 14. Select gate spacer structure 8 includes a first select gate spacer 32 and a second select gate spacer 36. First select gate spacer 32 is an oxidation product of the material forming select gate electrode 23, which may be polysilicon or the like. In some of these teaching, first select gate spacer 32 has a thickness in the range from 10 Å to 200 Å. In some of these teaching, first select gate spacer 32 has a thickness in the range from 10 Å to 100 Å. In some of these teaching, first select gate spacer 32 has a thickness greater than could be produced by native oxide formation. The native oxide formation process is self-limiting leading to a maximum thickness of 30 Å or less.

In some of these teachings, second select gate spacer 36 is an oxide formed by a deposition process. More generally, second select gate spacer 36 may be an oxide, a nitride, or the like. In some of these teaching, second select gate spacer 36 has a thickness in the range from 25 Å to 200 Å. In some of these teaching, second select gate spacer 36 has a thickness in the range from 50 Å to 100 Å.

In some of these teaching, the overall thickness 103 of select gate spacer structure 8 at its middle height is in the range from 35 Å to 200 Å. In some of these teaching, thickness 103 is in the range from 60 Å to 200 Å. Heavily doped memory source/drain regions 26 are formed in substrate 43 by doping in alignment with select gate spacer structure 8.

Select gate gaps 2302, which are the gaps between select gate spacer structures 8, have sidewalls 2303 that are substantially vertical. A substantially vertical sidewall is one that is within twenty degrees of perpendicular with respect to a surface of substrate 43. Sidewalls 2303 are within ten degrees of perpendicular with respect to a surface of substrate 43.

Select gate dielectric structure 12 includes first select gate dielectric layer 24 and second select gate dielectric layer 28. In some of these teaching, first select gate dielectric layer 24 thickness in the range from 5 Å and 100 Å. In some of these teaching, first select gate dielectric layer 24 thickness in the range from 10 Å and 50 Å. First select gate dielectric layer 24 may be an oxide, another suitable dielectric, or the like. In some of these teachings, first select gate dielectric layer 24 is an oxidation product of the material forming substrate 43. Second select gate dielectric layer 28 is an oxidation product of the material forming select gate electrode 23.

In some of these teachings, select gate dielectric structure 12 has a minimum thickness greater than 5 Å and a maximum thickness less than 200 Å. In some of these teachings, the thicknesses are in the range from 5 Å and 100 Å. In some of these teaching select gate dielectric structure 12 has a thickness that increases in relation to a distance from the floating gate electrode 14. In some of these teachings, select gate dielectric structure 12 has a maximum thickness 101 that is from 3 Å to 100 Å greater than its minimum thickness 102. In some of these teachings, the difference is in the range from 3 Å to 50 Å. In some of these teachings, the difference is in the range from 10 Å to 50 Å.

HKMG gate 70 includes high-κ dielectric 69 and a metal gate electrode 57. A logic gate sidewall spacer structure 66 is formed to the sides of metal gate electrode 57. Logic gate sidewall spacer structure 66 may include any suitable combination of material in any suitable thicknesses. In some embodiments, logic gate sidewall spacer structure 66 includes first sidewall spacers 39 and second sidewall spacers 38 respectively. In some embodiments, first sidewall spacer 39 are nitride or the like. In some embodiments, first sidewall spacer 39 have a thickness in the range from 25 Å to 1000 Å. In some embodiments, first sidewall spacer 39 have a thickness in the range from 50 Å to 500 Å. In some embodiments, second sidewall spacer 38 are oxide or the like. In some embodiments, second sidewall spacer 38 have a thickness in the range from 5 Å to 200 Å. In some embodiments, second sidewall spacer 38 have a thickness in the range from 10 Å to 100 Å. In some embodiments, logic gate sidewall spacer structure 66 is 5 Å to 200 Å thicker than overall thickness 103 of select gate spacer structure 8. In some embodiments, logic gate sidewall spacer structure 66 is 10 Å to 100 Å thicker than overall thickness 103 of select gate spacer structure 8.

A high κ dielectric may be a metal oxide or a silicate of hafnium (Hf), aluminum (Al), zirconium (Zr), lanthanum (La), magnesium (Mg), barium (Ba), titanium (Ti), lead (Pb), or the like. Examples of high κ dielectrics include $TiO_2$, $HfZrO$, $Ta_2O_3$, $HfSiO_4$, $ZrO_2$, and $ZrSiO_2$, or the like. High-κ dielectric 69 may have a thickness in the range from about 4 Å to about 100 Å. In some of these teachings, high-κ dielectric 69 has a thickness in the range from about 5 Å to about 25 Å. High-κ dielectric 69 may be separated from substrate 43 by oxide dielectric 68. Oxide dielectric 68 is a non-high κ dielectric. IC device 1 may include a variety of HKMG gates 70 having various thicknesses of oxide dielectric 68. Some HKMG gates may have oxide dielectric 68 in a thickness in the range from about 5 Å to about 25 Å. Other HKMG gates may have oxide dielectric 68 in a thickness in the range from about 25 Å to about 300 Å. Metal gate electrode 57 may have any suitable thickness. In some of these teachings, the thickness of metal gate electrode 57 is in the range from 300 Å to 1000 Å.

HKMG gate 70 may be formed over a deep well implant 59. Lightly doped HKMG source/drain regions 63 and heavily doped HKMG source/drain regions 65 may provide source/drain areas for HKMG gate 70 and may be aligned to sidewall spacers 39 and second sidewall spacers 38 respectively. Heavily doped HKMG source/drain regions 65 may have silicide pads 67 at their surfaces. HKMG gate 70 may have been formed by a gate-last process. Accordingly, HKMG gate 70 has not been subject to condition required to anneal the implant in heavily doped HKMG source/drain regions 65. If HKMG gate 70 were subject to such conditions, high-K dielectric 69 and metal gate electrode 57 would interact in a manner that would alter the threshold voltage of HKMG gate 70.

Various metallization layers may be formed above split gate flash memory cells 73 and HKMG gate 70. These include a first metallization layer that includes metal lines 2 formed in dielectric 3. Dielectric 3 may be a low-K dielectric. Additional metallization layer may be formed above the one shown. The metallization layers are coupled to source/drain regions by vias 31. Vias 31 pass through dielectric layers including an ILD0 layer 29 at the height of split gate flash memory cells 73 and HKMG gate 70, and an ILD1 layer 5 above split gate flash memory cells 73 and HKMG gate 70.

Substrate 43 is a semiconductor and may be or otherwise comprise, for example, a bulk silicon substrate, a SOI substrate, a group III-V substrate, another suitable semiconductor substrate(s). Substrate 43 may also be a binary semiconductor substrate (e.g., GaAs), a tertiary semiconductor substrate (e.g., AlGaAs), a higher order semiconductor substrate.

FIGS. 2-45 provide a series of cross-sectional views 600-4500 that illustrate an integrated circuit device according to the present disclosure at various stages of manufacture according to a process of the present disclosure. Although FIGS. 2-45 are described in relation to a series of acts, it will be appreciated that the order of the acts may in some cases be altered and that this series of acts are applicable to structures other than the ones illustrated. In some embodiments, some of these acts may be omitted in whole or in part. Furthermore, FIGS. 2-45 are described in relation to a series of acts, it will be appreciated that the structures shown in FIGS. 2-45 are not limited to a method of manufacture but rather may stand alone as structures separate from the method.

Figure 2:
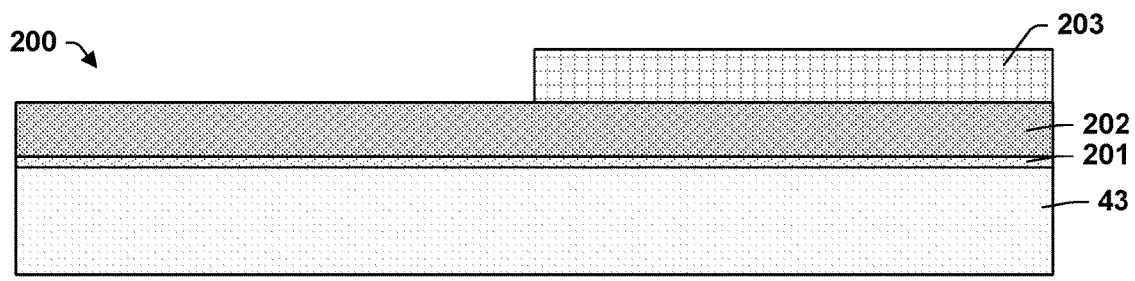

FIG. 2 provides a cross-sectional view 200 illustrating an initial step in which a pad oxide layer 201 and a pad nitride layer 202 are formed over substrate 43. A photoresist 203 may be formed and patterned to cover pad nitride layer 202 in a periphery area 91. Photoresist 203 may be used to selectively etch pad nitride layer 202 from memory area 90 as illustrated by cross-sectional view 300 of FIG. 3. As further illustrated by cross-sectional view 300 of FIG. 3, after stripping photoresist 203 an oxidation process may then be carried out to recess substrate 43 in memory area 90. Recessing substrate 43 in memory area 90 allows the tops of split gate flash memory cells 73 to align with the top of HKMG gates 70 in spite of split gate flash memory cells 73 having a greater height. The oxidation process produces the oxide layer 84. The oxidation process may be a wet oxidation process. Alternatively, the oxidation may be accomplished with a dry oxidation, steam oxidation, or some other suitable process.

Figure 4:
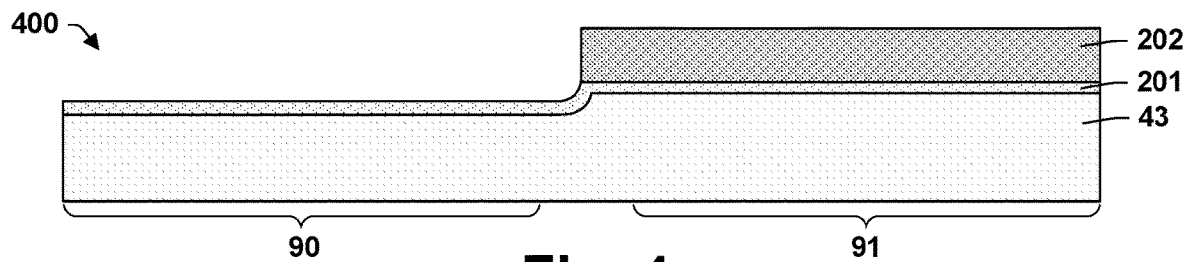

Oxide layer 84 may be thinned to approach the thickness of pad oxide layer 201 as illustrated by cross-sectional view 400 of FIG. 4. The original pad oxide layer 201 and pad nitride layer 202 may then be stripped and replaced with pad oxide layer 81 and pad nitride layer 82 as illustrated by cross-sectional view 500 of FIG. 5. Isolation regions 85 may then formed by laying down a patterned mask, etching through pad oxide layer 81, pad nitride layer 82, and into substrate 43, forming the oxide of isolation regions 85 by depositing the oxide or an oxide precursor. After the oxide is formed, chemical mechanical polishing (CMP) may be used to produce the level surface shown by cross-sectional view 500 of FIG. 5.

Figure 6:
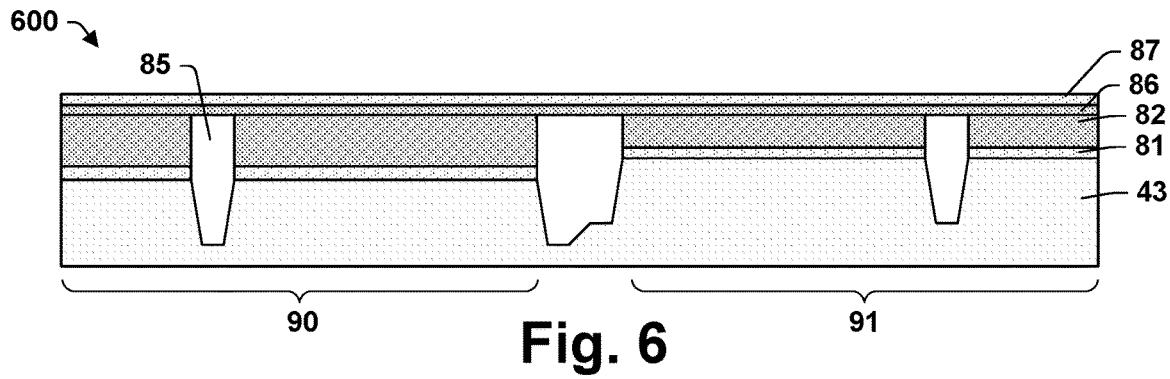

As illustrated by cross-sectional view 600 of FIG. 6, a nitride capping layer 86 and oxide capping layer 87 may then be formed. Oxide capping layer 87 may be a resist protective oxide, or some other suitable type of oxide. Alternative processing that does not include nitride capping layer 86 or oxide capping layer 87 is also feasible.

Figure 7:
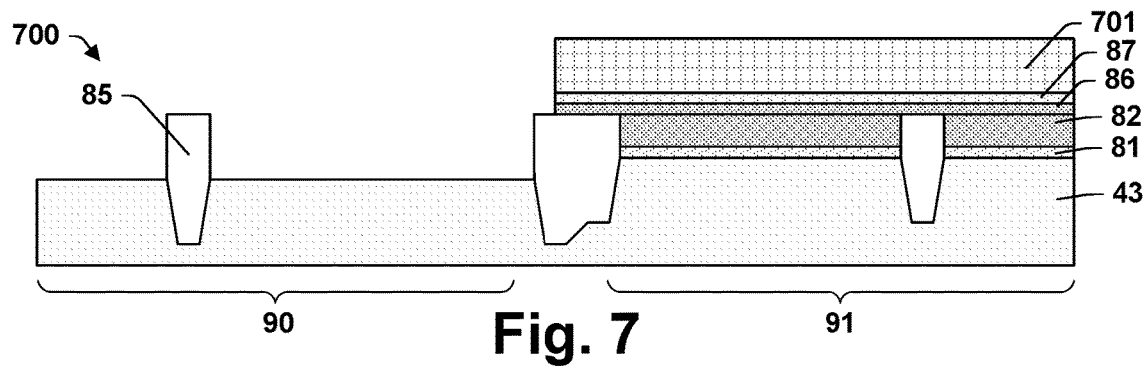

As illustrated by cross-sectional view 700 of FIG. 7, a photoresist 701 may be used to protect peripheral area 91 as the pad layers are removed from memory area 90. Photoresist 701 may then be stripped followed by deposition of floating gate dielectric layer 902 and floating gate electrode layer 901 and CMP to remove these layers and oxide capping layer 87 from periphery area 91 as illustrated by cross-sectional view 800 of FIG. 8. Floating gate dielectric layer 902 may be any suitable dielectric layer. Floating gate dielectric layer 902 may be grown on substrate 43 or deposited on substrate 43. Floating gate electrode layer 901 may be deposited conformally on floating gate dielectric layer 902 and may be doped polysilicon or the like. Floating gate electrode layer 901 may be formed by CVD, PVD, sputtering, or the like.

Figure 9:
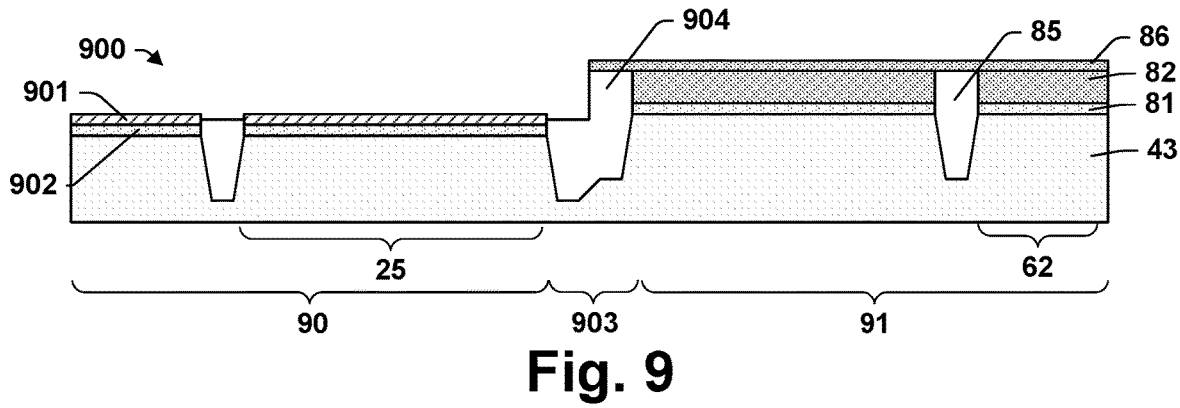
Figure 10:
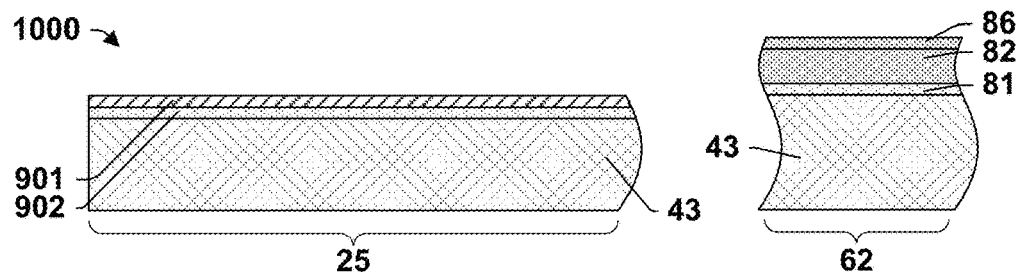

As illustrated by cross-sectional view 900 of FIG. 9, an etch process may then be carried out to reduce floating gate electrode layer 901 to a desired thickness. This etch back may be accomplished with a dry etch and a hydrofluoric acid (HF) dip or the like. FIG. 9 illustrates that memory area 90 and periphery area 91 are separated by a boundary region 903 with a boundary isolation structure 904. FIG. 9 also identifies memory region 25, which is an exemplary region within memory area 90. FIG. 9 further identifies logic region 62, which is an exemplary region within periphery area 91. FIG. 10 illustrates a cross-sectional view 1000 that corresponds to cross-sectional view 900 of FIG. 9 except that it focuses on just these two as do the subsequent cross-sectional views.

Figure 11:
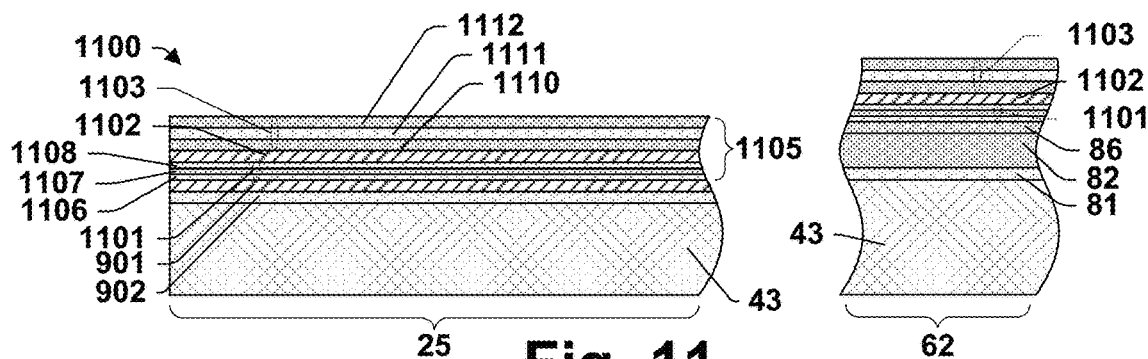

As illustrated by cross-sectional view 1100 of FIG. 11, a control gate stack 1105 may be formed over floating gate electrode layer 901. Control gate stack 1105 includes control gate dielectric layer 1101, control gate electrode layer 1102, and control gate hard mask layer 1103. Control gate dielectric layer 1101 may include one or more layers of oxide, nitride, another suitable dielectric(s), or the like. Control gate dielectric layer 1101 may include multiple layers of different dielectrics. In some embodiments, control gate dielectric layer 1101 is a charge trapping dielectric. In some embodiments, control gate dielectric layer 1101 includes an ONO film having a lower oxide layer 1106, a middle nitride layer 1107 covering lower oxide layer 1106, and an upper oxide layer 1108 covering middle nitride layer 1107. Control gate dielectric layer 1101 may be formed by CVD, PVD, another suitable deposition process(es), any combination of the foregoing, or the like.

Control gate dielectric layer 1101 is very thin. Lower oxide layer 1106 may have a thickness in the range from 10-100 Angstroms. In some embodiments, lower oxide layer 1106 has a thickness in the range from 20-50 Angstroms, e.g., about 40 Angstroms. Middle nitride layer 1107 may have a thickness in the range from 25-200 Angstroms. In some embodiments, middle nitride layer 1107 has a thickness in the range from 50-100 Angstroms, e.g., about 80

Angstroms. Upper oxide layer 1108 may have a thickness in the range from 10-100 Angstroms. In some embodiments, upper oxide layer 1108 has a thickness in the range from 20-50 Angstroms, e.g., about 40 Angstroms. In some embodiments, the total thickness of control gate dielectric layer 1101 is in the range from 25-400 Angstroms. In some embodiments, the total thickness of control gate dielectric layer 1101 is in the range from 50-200 Angstroms.

Control gate electrode layer 1102 may be formed conformally and may be formed of doped polysilicon or the like. In some embodiments, a process of forming control gate electrode layer 1102 includes depositing a material, implanting dopants into the material, and annealing to activate the dopants. The material of control gate electrode layer 1102 may be deposited by CVD, PVD, or another suitable deposition process(es). In some embodiments, control gate electrode layer 1102 has a thickness in the range from 600-2000 Angstroms. In some embodiments, control gate electrode layer 1102 has a thickness in the range from 300-1000 Angstroms. In some embodiments, control gate electrode layer 1102 has a thickness of about 600 Angstroms.

Control gate hard mask layer 1103 may include multiple layers of differing materials. Control gate hard mask layer 1103 may include oxide, nitride, or other suitable materials. In some embodiments, control gate hard mask layer 1103 includes an oxide layer 1111 over a first nitride layer 1110. In some embodiments, the thicknesses of these layers are in the range from 100 to 1400 Angstroms. In some embodiments, the thicknesses of these layers are in the range from 200 to 700 Angstroms for example. In some embodiments, these layers are about 400 Angstroms thick. In some embodiments, control gate hard mask layer 1103 further includes a second nitride layer 1112 over oxide layer 1111. Control gate hard mask layer 1103 may be formed by CVD, PVD, another suitable deposition process(es), any combination of the foregoing, or the like.

Figure 12:
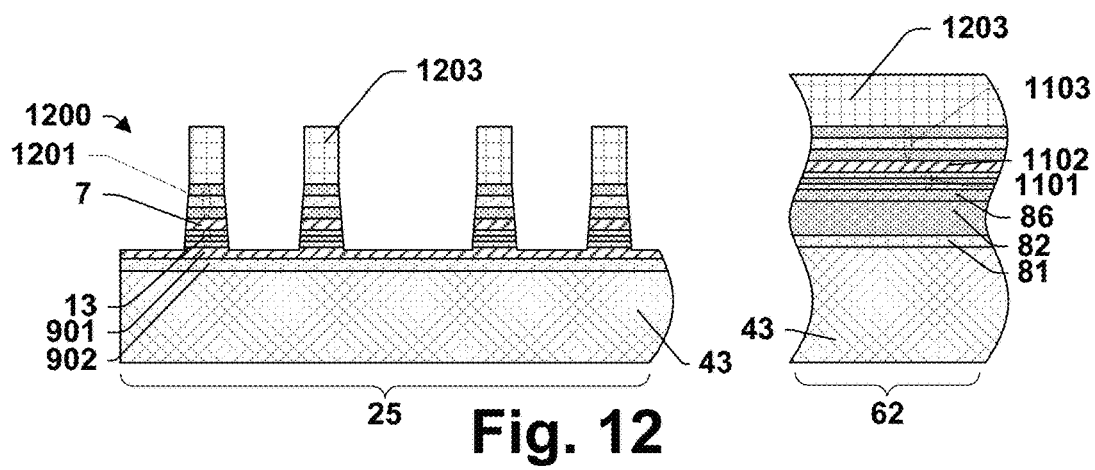

As illustrated by the cross-sectional view 1200 of FIG. 12, a selective etch may be performed to remove portions of control gate stack 1105 from memory region 25, thereby forming a control gate hard masks 1201, control gate electrodes 7, and control gate dielectric 13 over floating gate layer 901. In some embodiments, a process for performing the selective etch includes forming and patterning a photoresist layer 1203. Photoresist layer 1203 may be patterned to cover logic region 62 and portions of memory region 25 that form a negative image of control gate electrodes 7. Etch processes may then be applied with photoresist layer 1203 in place until floating gate electrode layer 901 is exposed. Photoresist layer 1203 may then be stripped.

Figure 13:
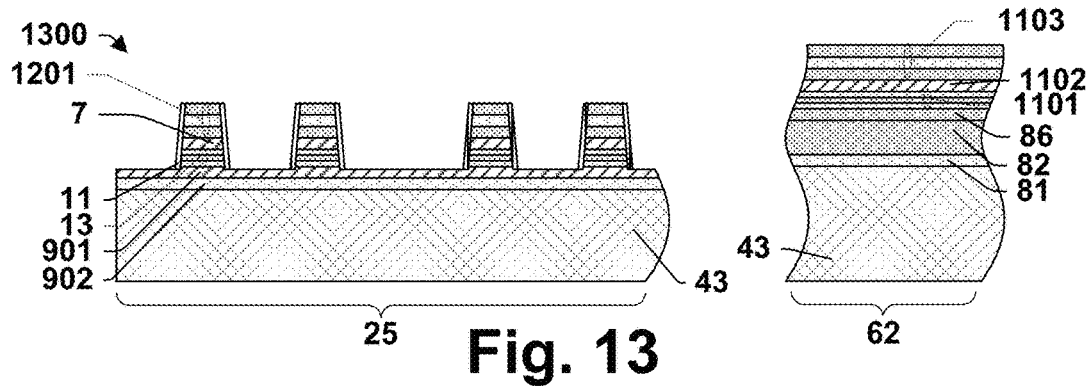

As illustrated by the cross-sectional view 1300 of FIG. 13, control gate spacers 11 may be formed adjacent control gate hard masks 1201. Control gate spacers 11 cover sidewalls of control gate electrodes 7. Control gate spacers 11 may be formed by depositing a layer of spacer material followed by etching. Control gate spacers 11 may have any suitable composition. Control gate spacers 11 may include one or more layers of oxide, nitride, another suitable dielectric(s), or the like. In some embodiments, control gate spacers 11 include ONO films, for example, a lower oxide layer, a middle nitride layer, and an upper oxide layer. The spacer material may be deposited by CVD, PVD, or another suitable deposition process(es). The etch process may include plasma etching or any other suitable etch process(es) that selectively removes the spacer material where it is thinnest with respect to the vertical. Control gate spacers 11 are shown with vertical sidewalls for ease of illustration. The etch process of spacer formation may produce rounded corners and smoothly tapering sidewalls.

Figure 14:
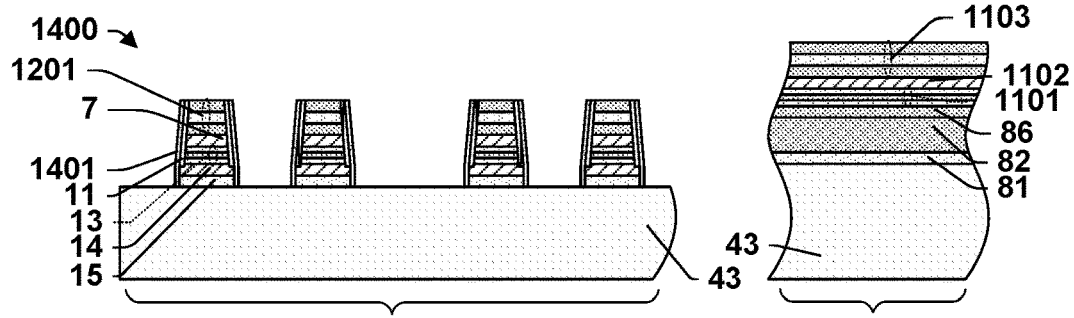

As illustrated by the cross-sectional view 1400 of FIG. 14, an etch may be performed into floating gate electrode layer 901 and floating gate dielectric layer 902 (see FIG. 13) to form floating gate electrodes 14 and floating gate dielectric 15. Control gate spacers 11 and control gate hard masks 1201 may serve as a mask for this etch. As further illustrated by the cross-sectional view 1200 of FIG. 14, floating gate spacers 1401 may be formed on sidewalls of floating gate electrodes 14 and control gate spacers 11. Floating gate spacers 1401 may be oxide, another suitable dielectric(s), or the like. A process of forming floating gate spacers 1401 may include depositing a floating gate spacer layer over the structure illustrated by the cross-sectional view 1400 of FIG. 14 followed by plasma etching or any other suitable etch process(es) that selectively removes the floating gate spacer layer where it is thinnest with respect to the vertical. The floating gate spacer layer may be deposited conformally by CVD, PVD, or another suitable deposition process(es).

Figure 15:
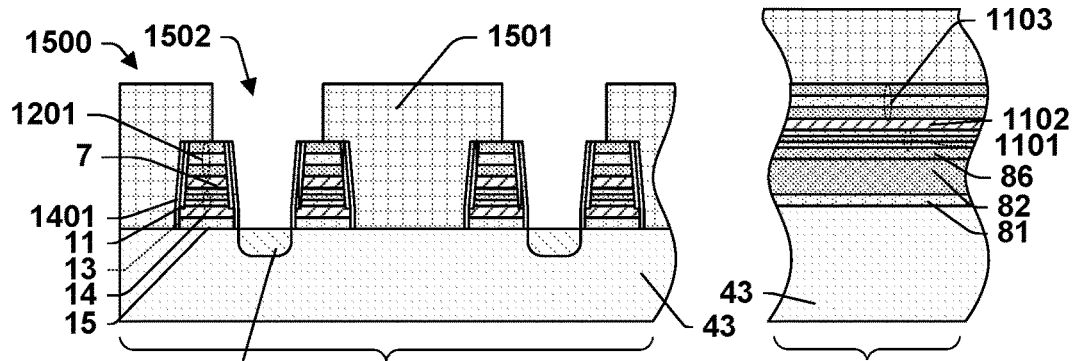

As illustrated by the cross-sectional view 1500 of FIG. 15, lightly doped memory source/drain regions 21 may be formed in substrate 43 laterally between floating gate electrodes 14. A process of forming heavily (common source is high-dosage implantation) doped memory source/drain region 21 may include forming and patterning a photoresist layer 1501 covering logic region 62 and portions of memory region 25 outside common source/drain gaps 1502. Ion implantation or another suitable doping process(es) may be performed with photoresist layer 1501 in place. Photoresist layer 1501 may be patterned using photolithography.

Figure 16:
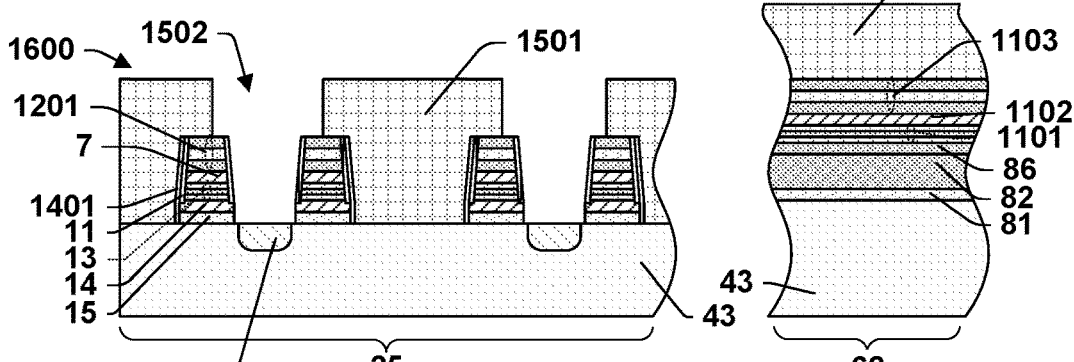

As illustrated by the cross-sectional view 1600 of FIG. 16, floating gate spacers 1401 within common source/drain gap 1502 may be removed. A process for removing floating gate spacers 1401 may include etching with photoresist layer 1501 in place. Photoresist layer 1501 may thereafter be stripped.

Figure 17:
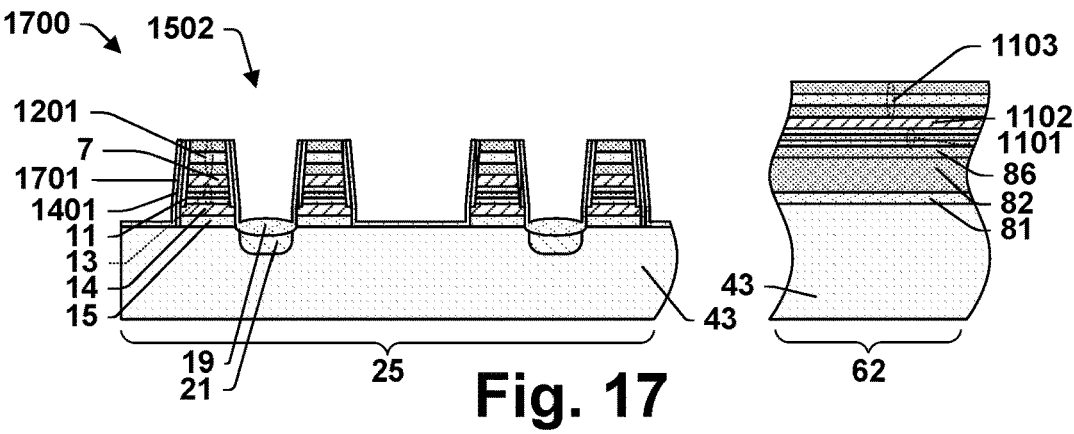

As illustrated by the cross-sectional view 1700 of FIG. 17, erase gate dielectric 19 may be formed to cover memory source/drain region 21 and line sidewalls of floating gate electrodes 14 and control gate spacers 11 within common source/drain gap 1502. Erase gate dielectric 19 may be formed of oxide, nitride, or another suitable dielectric(s). A process of forming erase gate dielectric 19 may include high temperature oxidation (HTO), in situ steam generation (ISSG) oxidation, another suitable deposition or growth process(es), any combination of the foregoing, or the like. In some embodiments, erase gate dielectric 19 is formed with a by an oxide deposition process followed by an oxide growth process. In some embodiments, erase gate dielectric 19 develops a curved or bulbous surface profile due to ion implantation in memory source/drain region 21. The central region of memory source/drain region 21 receives a larger dose of dopants and as a result undergoes more damage than the peripheral region of the memory source/drain region 21. The oxide may consequentially grow more rapidly in the central region as compared to the peripheral region.

As illustrated by the cross-sectional view 1800 of FIG. 18, a photoresist layer 1801 may be formed to cover logic region 62 and portions of memory region 25 outside intercell gaps 1802 and used to remove floating gate spacers 1401 from within intercell gaps 1802. As illustrated by the cross-sectional view 1900 of FIG. 19, after removing photoresist layer 1801, first select gate dielectric layer 24 and erase gate sidewall spacers 22 may then be formed in intercell gaps 1802. First select gate dielectric layer 24 and erase gate sidewall spacers 22 may be one or more layers of oxide, nitride, or another suitable dielectric(s), or the like. First select gate dielectric layer 24 and erase gate sidewall spacers 22 may be formed by HTO, ISSG oxidation, another suitable deposition or growth process(es), any combination of the foregoing, or the like.

Also illustrated by the cross-sectional view 2000 of FIG. 20, a select gate electrode layer 2001 may be formed covering first select gate dielectric layer 24 and other structures in logic region 62 and memory region 25. Select gate electrode layer 2001 may be formed of doped polysilicon or the like, or another suitable conductive material(s) and may be formed by CVD, PVD, or another suitable deposition process(es). Cross-sectional view 2000 of FIG. 20 also illustrates a memory antireflective coating (ARC) 2002 formed over select gate electrode layer 2001. Memory ARC 2002 may be formed, for example, from a flowable organic material applied by a spin-on process wherein a wafer of substrate 43 is spun about its center while a liquid ARC coating is on the wafer surface. Because of its flowability, the liquid ARC coating tends to develop a level surface. After the liquid ARC coating is spun-on, a baking step may be carried out to harden memory ARC 2002.

As illustrated by the cross-sectional view 2100 of FIG. 21, a process(es) may be carried out to remove memory ARC 2002 (see FIG. 20) and to thin select gate electrode layer 2001. This process forms erase gate electrodes 18. The removal and thinning may be carried out with an etch process(es) for which memory ARC 2002 and select gate electrode layer 2001 have approximately equal susceptibilities. Memory ARC 2002 may be etched back until select gate electrode layer 2001 is exposed after which select gate electrode layer 2001 and memory ARC 2002 may be etched back together until memory ARC 2002 is completely removed. Select gate electrode layer 2001 may then be etched back until its top surface is about even with top surfaces of control gate electrodes 7. The etch process leaves the recessed select gate electrode layer 2001 with a substantially planar surface. Dopants may be implanted into or with the select gate electrode layer 2001 followed by an anneal to activate the dopants. Photoresist masks may be used to allow the dopant type to be varied between n-type and p-type or to otherwise allow the doping to be varied for differing regions and device types.

As illustrated by cross-sectional view 2200 of FIG. 22, a memory select gate hard mask layer 2201 may be formed conformally over the structure illustrated by cross-sectional view 2100 of FIG. 21. Memory select gate hard mask layer 2201 may be formed of nitride, oxide, or another suitable hard mask material(s). Memory select gate hard mask layer 2201 may be formed by CVD, PVD, or another suitable deposition process(es).

As illustrated by the cross-sectional view 2300 of FIG. 23, an etch may be used to form select gate hard masks 2301 and an erase gate hard masks 2302 from memory select gate hard mask layer 2201 (see FIG. 22). This first part of this etch process forms select gate hard masks 2301 and erase gate hard masks 2302. Select gate hard masks 2301 develop a spacer-shape. The spacer-shape results from select gate hard mask layer 2201 being deposited over a mandrel defined by gate stacks 2202 (see FIG. 22) and then being etched using an anisotropic etching process. The same or another anisotropic etch process may then be used to pattern select gate electrode layer 2001 to form select gate gaps 2304 while leaving the areas covered by select gate hard masks 2301 to form select gate electrodes 23. The etch processes may be plasma etch processes or the like. Select gate gaps 2304 has sidewalls 2303 that are substantially vertical adjacent select gate electrodes 23. Sidewalls 2303 are within ten degrees of perpendicular with respect to a surface of substrate 43.

As illustrated by the cross-sectional view 2400 of FIG. 24, etching may be performed with a photoresist mask 2401 covering the illustrated portion of memory region 25. This additional etching may terminate conductive lines that are formed by some of the illustrated structures in the direction of the page. This etching may thin control gate hard mask layer 1103 over logic region 62.

As illustrated by the cross-sectional view 2500 of FIG. 25, a second ARC 2501 may be formed over the structure illustrated by the cross-sectional view 2400 of FIG. 24. Second ARC 2501 may be formed with a top surface that is planar or substantially planar. Second ARC 2501 may be used in conjunction with a non-selective etch back process to recesses an uppermost portion of the structure illustrated by the cross-sectional view 2400 of FIG. 24 to produce the structure illustrated by cross-sectional view 2600 of FIG. 26. The etch back process may stop on or in control gate hard mask layer 1103, control gate hard masks 1201, and select gate hard masks 2301. After the etch back process, second ARC 2501 may be removed as shown by the cross-sectional view 2600 of FIG. 26.

As illustrated by the cross-sectional view 2600A of FIG. 26A, an oxidation process is carried out to oxidize a surface layer of select gate electrodes 23 to form first select gate spacers 32. This process maintains the verticality of sidewalls 2303 of select gate gaps 2302 and does not narrow select gate gaps 2302 significantly. Some of the oxidizing reagents that form first select gate spacers 32 may diffuse through first select gate dielectric layer 24 to oxidize a bottom portion of select gate electrodes 23 and form second select gate dielectric layer 28. The oxidation process may be a wet oxidation process, a high temperature oxidation (HTO), in situ steam generation (ISSG), another suitable oxidation process, or the like. In some of these teachings, the oxidation process is a wet oxidation process. In some of these teachings, the oxidation process is a dry oxidation process.

Figure 27:
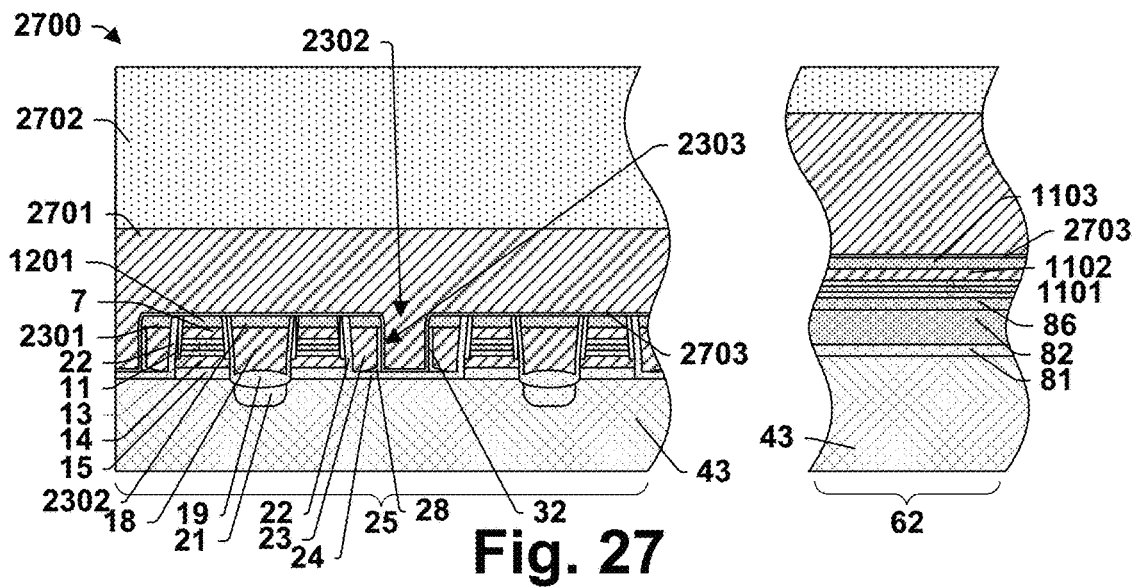

As illustrated by the cross-sectional view 2700 of FIG. 27, a liner layer 2703, a memory capping layer 2701, and a bottom anti-reflective coating (BARC) 2702 may be formed over the structure illustrated by cross-sectional view 2600A of FIG. 26A. Memory capping layer 2701 is a protective layer in that it is a temporary layer that will protect structures in memory region 25 through a series of processing steps directed to other regions of substrate 43 and subsequently be removed. Memory capping layer 2701 may be polysilicon or the like. Liner layer 2703 may have a composition suitable to provide an etch stop for the subsequent removal of memory capping layer 2701. In some of these teachings, liner layer 2703 is an oxide or the like. In accordance with some aspects of the present teachings, a portion of liner layer 2703 will remain in IC device 1 to provide a portion of select gate spacer structure 8.

Liner layer 2703 may be formed by any suitable process. In some of these teachings, liner layer 2703 is formed by a process that maintains the verticality of sidewalls 2303 of select gate gaps 2302. A suitable process for this purpose is ALD or the like. An ALD is a cyclic process including a phase in which the surface to be coated becomes saturated with a reagent used to form the coating. Another phase is in the cycle causes a reaction by which a layer of the coating is formed from a reaction that includes the reagent. Saturation allow the reagent to uniformly distribute prior to reaction. The ALD process maintains verticality of sidewalls 2303 and provides control over the thickness of liner layer 2703, which facilitates providing sufficient thickness to select gate spacer structure 8 without unnecessarily narrowing select gate gaps 2302.

Memory capping layer 2701 may be formed by CVD, PVD, another suitable deposition process(es), any combination of the foregoing, or the like. Memory capping layer 2701 may partially conform to the surface it covers. BARC 2702 facilitates leveling memory capping layer 2701. BARC 2702 may be formed from a liquid coating that is spun on over memory capping layer 2701 to provide a top surface that is planar or substantially planar. After BARC 2702 is spun-on, a baking step may be carried out to harden the BARC 2702.

Figure 28:
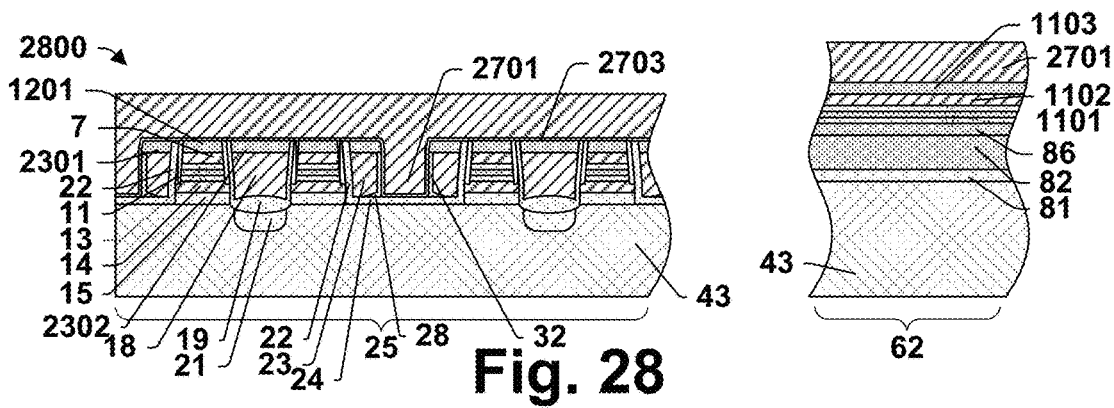

As illustrated by the cross-sectional view 2800 of FIG. 28, a process may be carried out to remove BARC 2702 (see FIG. 27) and leave memory capping layer 2701 with a recessed and relatively level surface. The process may be an etch under which BARC 2702 and memory capping layer 2701 have very similar etch rates. Initially, the etch proceeds through BARC 2702 until memory capping layer 2701 is exposed. The etch continues simultaneously etching BARC 2702 and memory capping layer 2701 until BARC 2702 is completely removed. This etch process may leave memory capping layer 2701 with a well-defined thickness over memory region 25.

Figure 29:
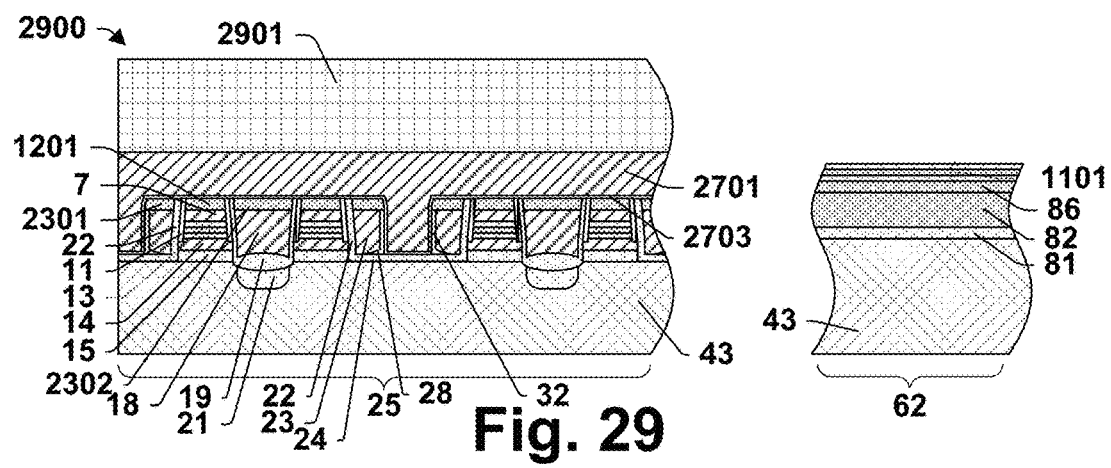

As illustrated by the cross-sectional view 2900 of FIG. 29, a photoresist mask 2901 may be formed and patterned over memory capping layer 2701 in memory region 25. Like other photoresist masks, photoresist mask 2901 may be formed by a process that includes spin-coating or otherwise forming a photoresist on a surface of the structure, selectively exposing the photoresist to light through a reticle or other photolithographic mask, and removing the exposed or unexposed portion using a chemical developer. With mask 2901 in place, an etch may be performed to remove control gate electrode layer 1102 and control gate hard mask layer 1103 from logic region 62. After etching, photoresist mask 2901 may be removed. Like other photoresist masks, photoresist mask 2901 may be removed by full exposure and development, etching, ashing, or any other suitable removal process(es). As illustrated by the cross-sectional view 3000 of FIG. 30, additional etching may be performed to remove control gate dielectric layer 1101 and nitride capping layer 86 from logic region 62.

Figure 30:
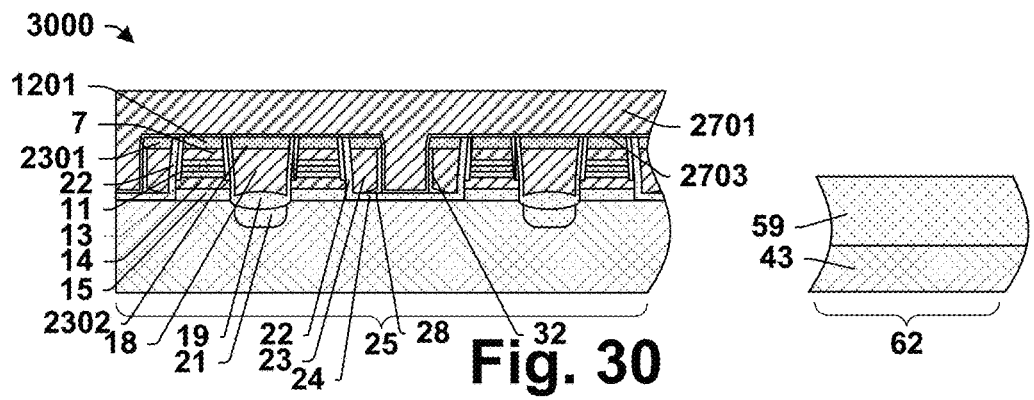
Figure 31:
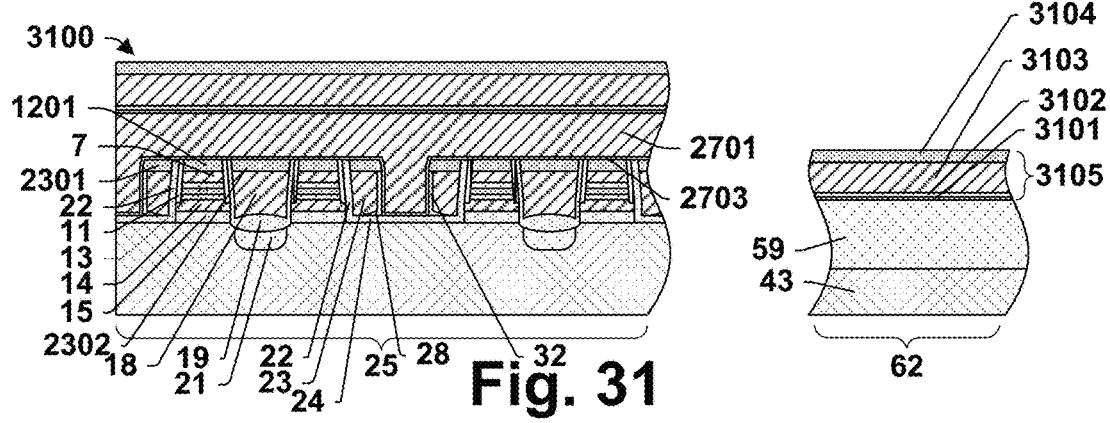

As illustrated by the cross-sectional view 3100 of FIG. 31, a dummy gate stack 3105 may be formed over the structure illustrated by cross-sectional view 3000 of FIG. 30. Dummy gate stack 3105 may include an oxide layer 3101, a high-κ dielectric layer 3102, a dummy gate electrode layer 3103, and a dummy gate hard mask layer 3104. In general, the dummy gate stack dielectrics may include any suitable number and combination of dielectric layers and may be made with thicknesses and/or compositions that vary among different devices in logic region 62. Dummy gate electrode layer 3103 may be polysilicon or the like or another suitable material(s). Dummy gate hard mask layer 3104 may be nitride, oxide, polysilicon, or the like. The layers of dummy gate stack 3105 may be formed conformally by CVD, PVD, electroless plating, electroplating, another suitable growth or deposition process(es), any combination of the foregoing, or the like. Oxide layer 3101 may be grown on substrate 43.

Figure 32:
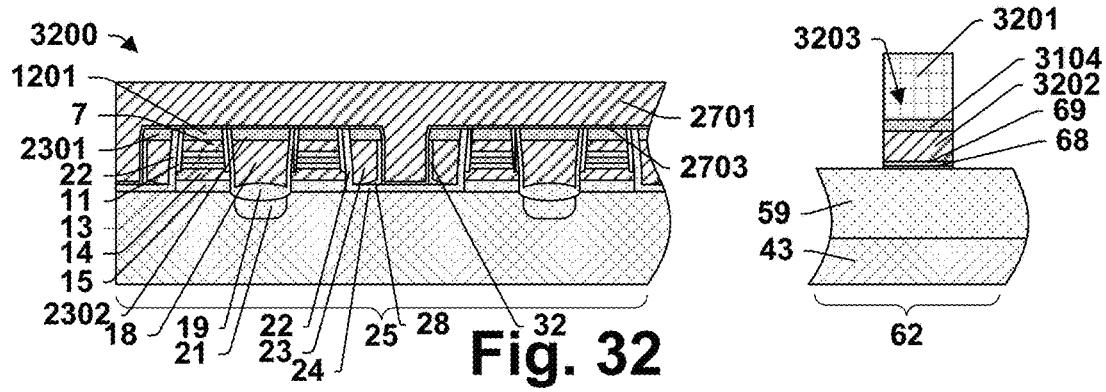

As illustrated by the cross-sectional view 3200 of FIG. 32, a photoresist 3201 may be used to define dummy gate 3203 in logic region 62 while oxide layer 3101, high-K dielectric layer 3102, dummy gate electrode layer 3103, and dummy gate hard mask layer 3104 are removed from other locations. This etch forms oxide dielectric 68 from oxide layer 3101, high-K dielectric 69 from high-K dielectric layer 3102, and dummy gate electrode 3202 from dummy gate electrode layer 3103. This process may effectively remove high-K dielectric layer 3102 from areas outside logic region 62.

Figure 33:
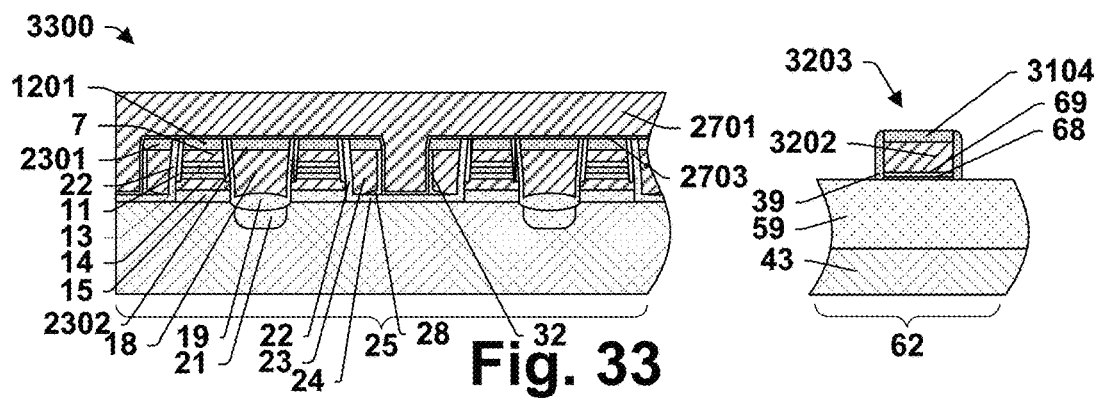

As illustrated by the cross-sectional view 3300 of FIG. 33, sidewall spacers 39 may then be formed on the sides of dummy gate 3203. Sidewall spacers 39 may be oxide, nitride, another suitable dielectric(s), any combination of the foregoing, or the like. Sidewall spacers 39 may be formed by a spacer patterning technique that includes depositing over a mandrel provided by dummy gate 3203 and etching to remove the spacer material where it is thinnest with respect to the vertical. The spacer material may be deposited conformally by CVD, PVD, another suitable deposition process(es), any combination of the foregoing, or the like. The spacer material may be etched to form sidewall spacers 39 by any suitable etch process. A suitable etch process may be an anisotropic plasma etch or the like.

Figure 34:
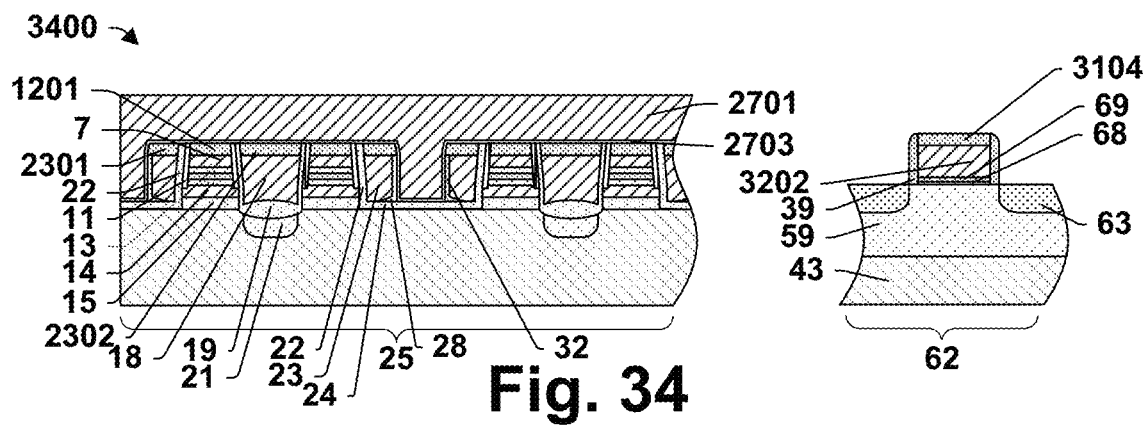

As illustrated by the cross-sectional view 3400 of FIG. 34. Dopants may be implanted to form lightly doped logic source/drain regions 63 in logic region 62. Lightly doped logic source/drain regions 63 may be formed in alignment with sidewall spacers 39. Photoresist masks may be used to provide doping types and concentrations that vary among of logic region 62 and other regions of periphery area 91 (see FIG. 9).

Figure 35:
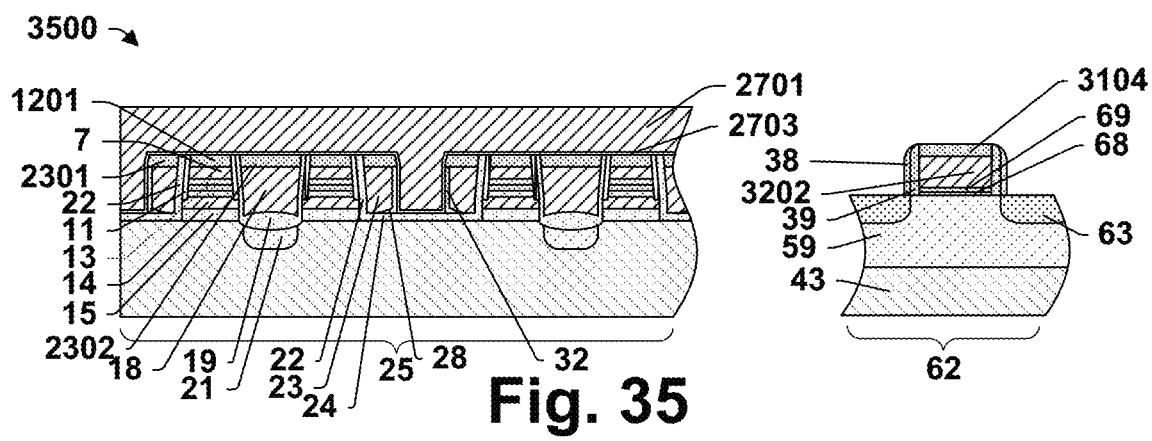

As illustrated by the cross-sectional view 3500 of FIG. 35, second sidewall spacers 38 may then be formed adjacent dummy gate 3203. These spacers may also be formed by a spacer patterning technique. Second sidewall spacers 38 may be oxide or the like.

Figure 36:
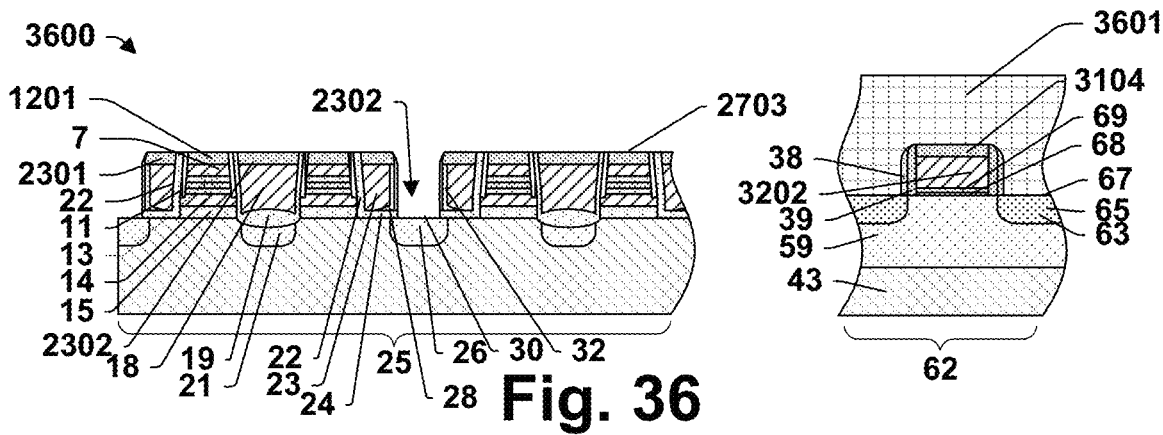

As illustrated by the cross-sectional view 3600 of FIG. 36, a photoresist 3601 may then be used to mask logic region 62 while memory capping layer 2701 is etched from memory region 25. Liner layer 2703 may provide an etch stop for this removal process. An anisotropic etch process may be carried out to remove liner layer 2703 and first select gate dielectric layer 24 from the bottoms of select gate gaps 2302. Dopants may then be implanted to form lightly doped memory source/drain regions 27.

Figure 37:
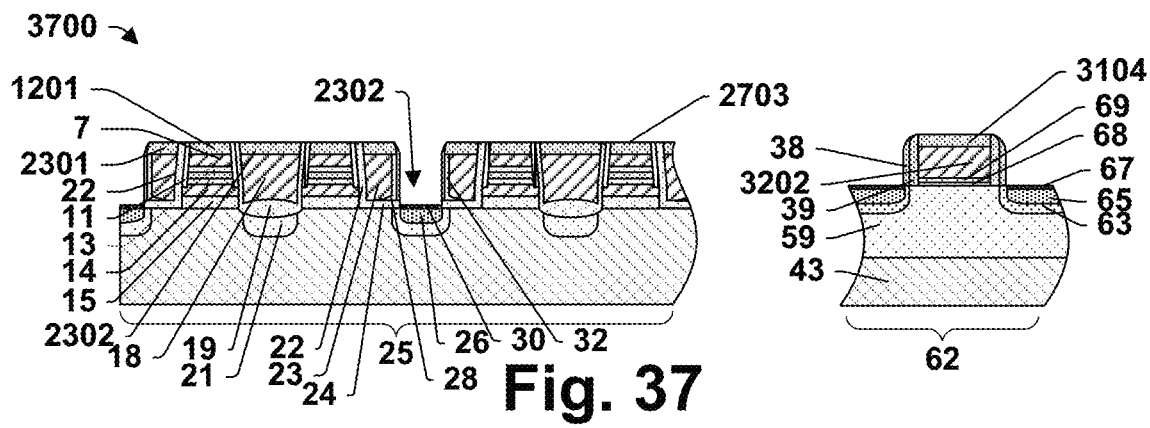

As illustrated by the cross-sectional view 3700 of FIG. 37, additional dopants may be implanted to form heavily doped memory source/drain regions 26 in memory region 25 and heavily doped HKMG source/drain regions 65 in logic region 62. Heavily doped memory source/drain regions 26 may be formed in alignment with liner layer 2703. Heavily doped HKMG source/drain regions 65 are formed in alignment with second sidewall spacers 38. The doping may be carried out in a series of steps with various regions and sub-regions masked to provide a range of doping concentrations and types for various devices. After doping, annealing may be carried out to activate the dopants within substrate 43. As further shown by the cross-sectional view 3700 of FIG. 37, a salicidation process may be carried out to form silicide pads 30 and silicide pads 67 on heavily doped memory source/drain regions 26 and heavily doped HKMG source/drain regions 65 respectively. The silicide may be nickel silicide, titanium silicide, cobalt silicide, another silicide(s), or the like and may be formed by any suitable saliciding process(es).

Figure 38:
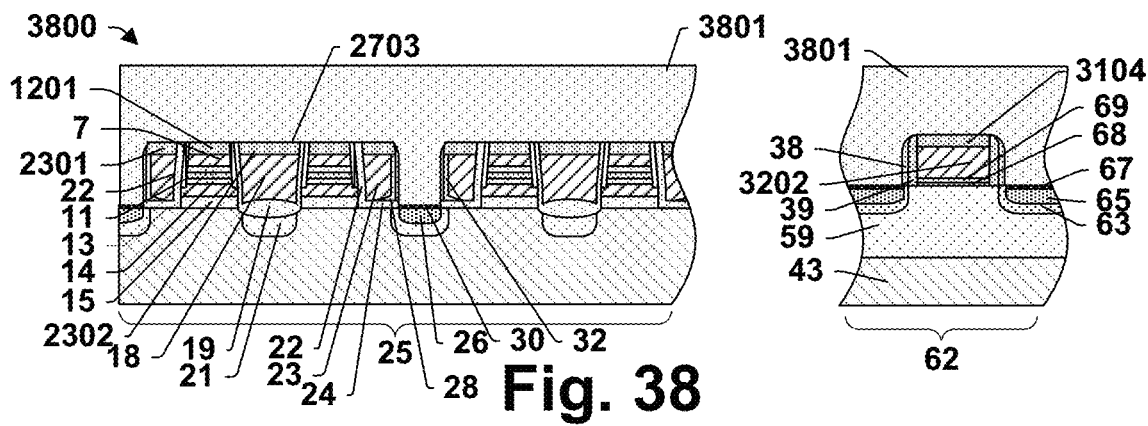

As illustrated by the cross-sectional view 3800 of FIG. 38, a second ARC 3801 may then be formed over the structure illustrated by the cross-sectional view 3700 of FIG. 37. Second ARC 3801 may be formed with a top surface that is planar or substantially planar. A process of forming the second ARC 3801 may include spinning on an organic ARC coating. As illustrated by the cross-sectional view 3900 of FIG. 39, a process may then be performed to remove an upper layer from the structure illustrated by cross-sectional view 3800 of FIG. 38. This process forms second select gate spacers 36 from liner layer 2703. The removal process be a CMP process. In some embodiments, however, the removal is accomplished with etching using process(es) for which the various materials being removed have similar susceptibilities whereby the upper surface remains substantially planar. A suitable etch process may be a dry etch that includes plasma from fluorocarbon and He etchants.

As illustrated by the cross-sectional view 4000 of FIG. 40, second ARC 3801 may then be removed followed by formation of contact etch stop layer 33 and ILD0 layer 29 as illustrated by the cross-sectional view 4100 of FIG. 41. ILD0 layer 29 may be oxide, a low K dielectric, another suitable dielectric(s), any combination of the foregoing, or the like. Second ARC 3801 may be removed by etching or any other suitable removal process(es). A process of forming ILD0 layer 29 may include CVD, PVD, sputtering, or any other suitable process(es). As illustrated by the cross-sectional view 4200 of FIG. 42, ILD0 layer 29 may be planarized and its top surface recessed to expose dummy gate electrode 3202. Planarization and recessing may be by CMP or any other suitable process or combination of process(es).

As illustrated by the cross-sectional view 4300 of FIG. 43, a photoresist 4301 may be used to cover memory region 25 while an etch is performed to remove dummy gate electrodes 3202, leaving voided areas 4302. As illustrated by cross-sectional view 4400 of FIG. 44, metal gate electrodes 57 may then be formed by filling voided areas 4302 with. The filling may include one more layers of various metals formed by CVD, PVD, electroless plating, electroplating, or another suitable growth or deposition process(es). Metal that deposits or grows outside voided areas 4302 may then be removed by planarization. The planarization process may be CMP or the like.

As illustrated by the cross-sectional view 4500 of FIG. 45, a hard mask 4501 may be formed and patterned to cover logic region 62 and control gate electrodes 7 while silicide pads 9 and silicide pads 17 are formed on select gate electrodes 23 and erase gate electrodes 18 respectively. The silicides may be nickel silicide, another silicide(s), or the like and may be formed by any suitable saliciding process(es).

Additional processing may take place to form the structure of FIG. 1. This additional processing forms ILD1 layer 5, dielectric 3, vias 31, and metal lines 2. These may be formed by any suitable processes or combination of processes including, for example, damascene processes, dual damascene processes, and the like.

Figure 46A:
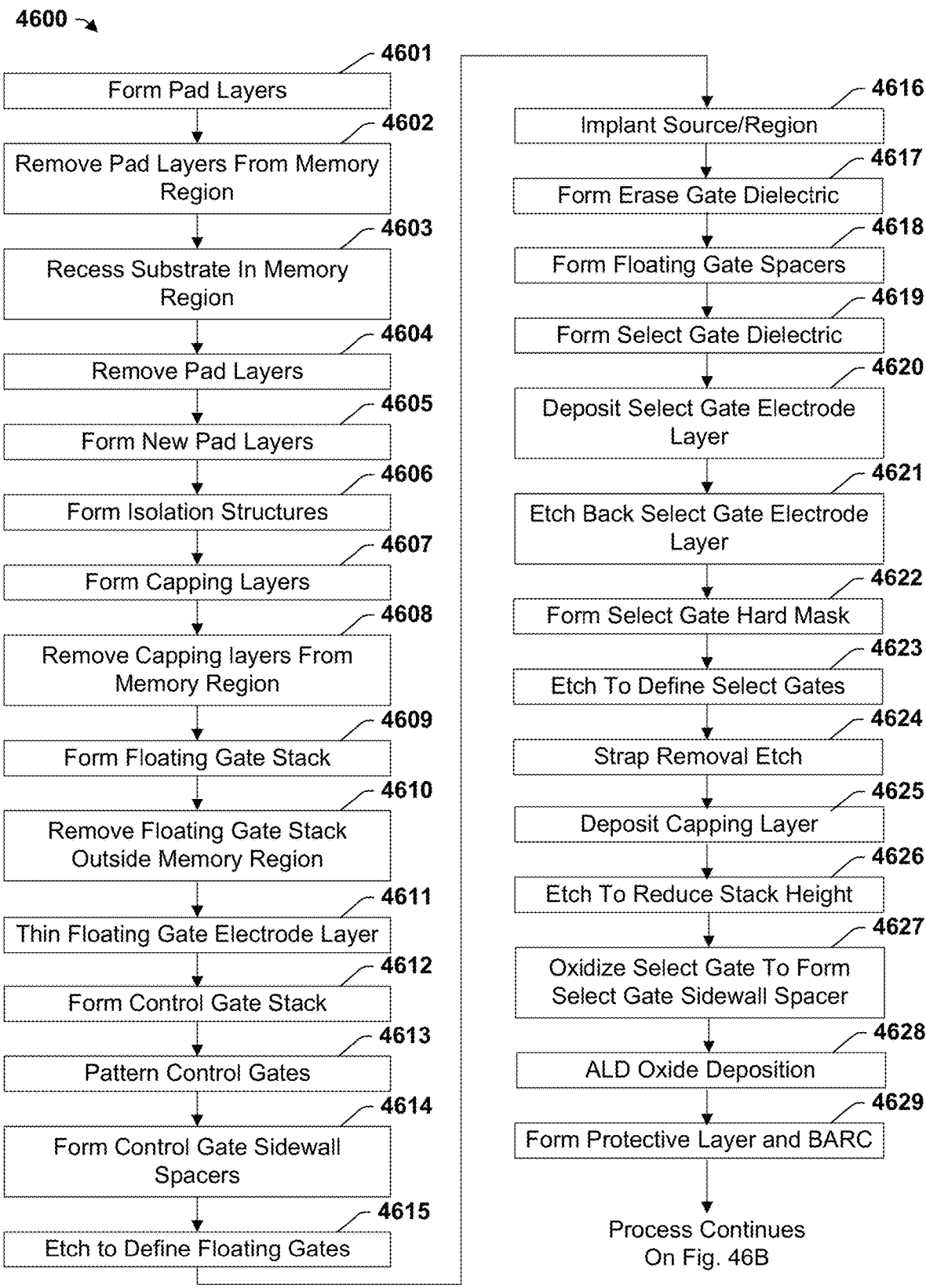
FIGS. 46A and 46B present a flow chart of a manufacturing process according to some aspects of the present disclosure.
Figure 46B:
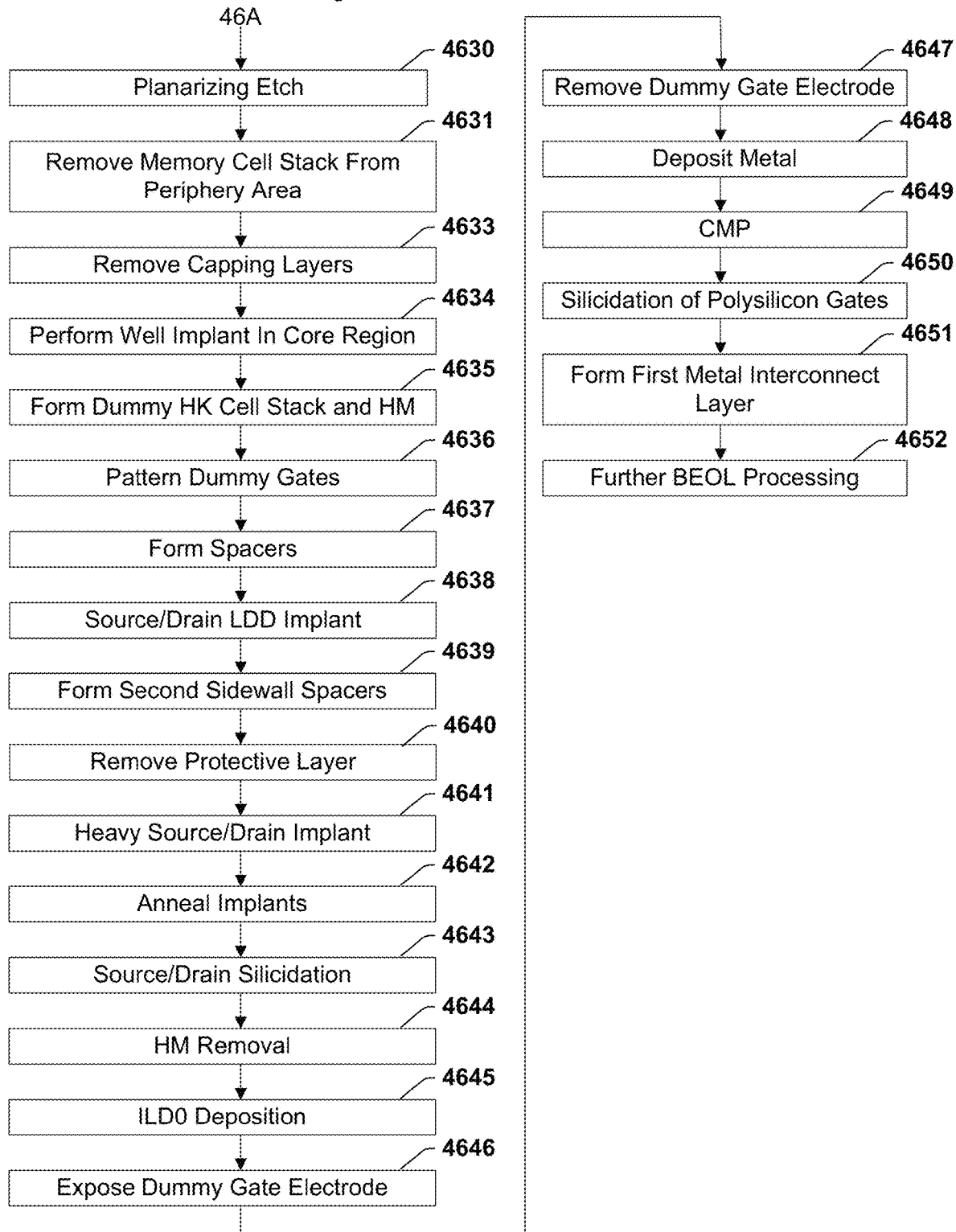

FIGS. 46A and 46B provides a flow chart of a process 4600 according to some aspects of the present disclosure that may be used to produce integrated circuit devices according to the present disclosure. While process 4600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 3:
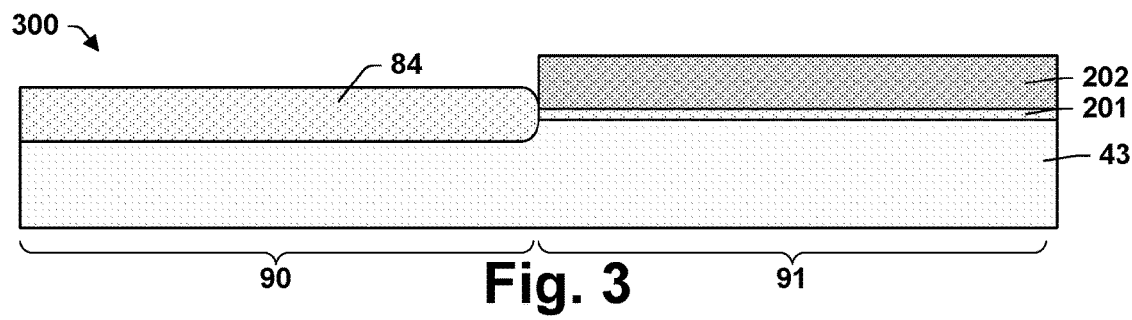

Process 4600 begins with act 4601, forming pad layers, which may be pad oxide layer 201 and pad nitride layer 202, on a substrate 43 as shown in FIG. 2. Process 4600 continues with act 4602 removing pad oxide layer 201 and pad nitride layer 202 from memory area 90 as shown in FIG. 3. Act 4603 is recessing substrate 43 in memory area 90, as is also shown in FIG. 3.

Figure 5:
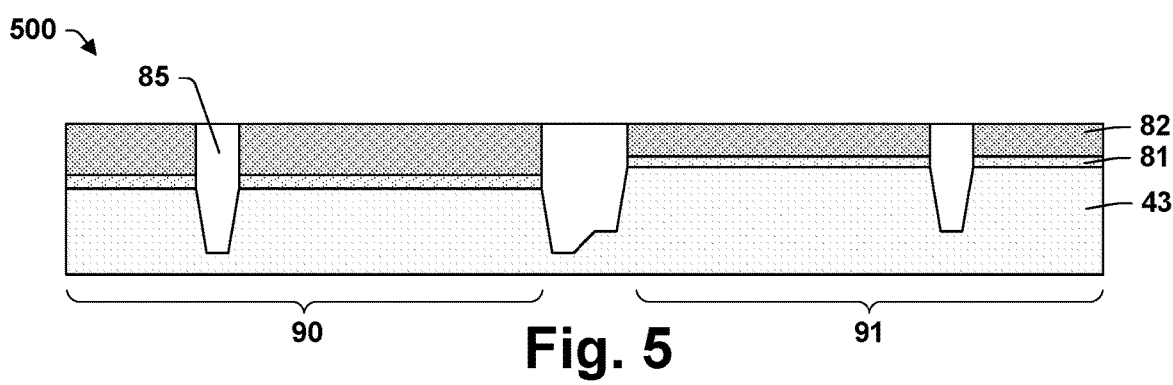
Figure 8:
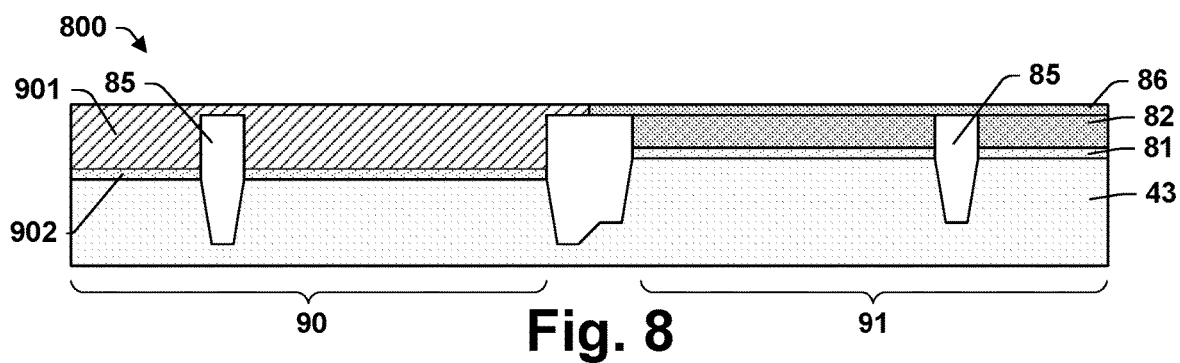

Act 4604 is removing pad oxide layer 201 and pad nitride layer 202. Act 4605 is forming new pad oxide layer 81 and new pad nitride layer 82, which are shown in FIG. 5. Act 4606 is forming isolation region 85 as shown in FIG. 8.

Act 4607 is forming nitride capping layer 86 and oxide capping layer 87 as shown in FIG. 6. Act 4608 is removing nitride capping layer 86 and oxide capping layer 87 from memory area 90 as shown in FIG. 7. Act 4609 is forming a floating gate stack including floating gate dielectric layer 902 and floating gate electrode layer 901. Act 4610 is planarizing to remove the floating gate from periphery area 91 as shown in FIG. 8. Act 4611 is thinning floating gate electrode layer 901 to a desired thickness as show in FIGS. 9 and 10.

Act 4612 is forming control gate stack 1105 including control gate dielectric layer 1101, control gate electrode layer 1102, and control gate hard mask layer 1103 as shown in FIG. 11. Act 4613 is patterning to define control gates including control gate dielectrics 13, control gate electrodes 7, and control gate hard masks 1201 as shown in FIG. 12. Act 4614 is forming control gate spacers 11 as shown in FIG. 13.

Act 4615 is etching to define floating gates including floating gate dielectrics 15 and floating gate electrodes 14. Act 4616 is doping to provide memory source/drain regions 21 in memory region 25, as shown in FIG. 15. Act 4617 is forming erase gate dielectric 19 as shown in FIG. 17. Act 4618 is forming floating gate spacers 22 as shown in FIG. 19. Act 4619 is forming first select gate dielectric layer 24, as also shown in FIG. 19. Act 4620 is depositing select gate electrode layer 2001, as also shown in FIG. 20. Act 4621 is etching back select gate electrode layer 2001 to approximately the height of control gate electrodes 7, defining erase gate electrodes 18 as shown in FIG. 21.

Act 4622 is forming select gate hard mask layer 2201 as shown in FIG. 22. Act 4623 is an etch to define select gate hard masks 2301 from select gate hard mask layer 2201 and select gate electrodes 23 from select gate electrode layer 2001 as shown in FIG. 23. Act 4623 first forms select gate hard masks 2301 from select gate hard mask layer 2201 then etches through select gate electrode layer 2001 using select gate hard masks 2301 as a mask. Acts 4622 and 4623 form select gate hard masks 2301 according to a spacer patterning technique. Act 4624 is a strap removal etch. This results in a thinning of control gate hard mask 1103 in logic region 62 as shown in FIG. 24. The strap removal etch may occur elsewhere in the sequence of process 4600. Act 4625 is forming second ARC 2501 as shown in FIG. 25. Act 4626 is a planarizing etch that reduces the height of the memory stack as shown in FIG. 26.

Act 4627 is an oxidation process that forms first select gate spacers 32 by oxidizing select gate electrodes 23 as shown in FIG. 26A. The oxidation process may also form second select gate dielectric layer 28. Act 4628 is ALD to form liner layer 2703 as shown in FIG. 27 Act 4629 is depositing memory capping layer 2701 and dummy BARC 2702 as also shown in FIG. 27. Act 4630 is a planarizing etch that removes dummy BARC 2702 as shown in FIG. 28. Act 4631 is removing the memory cell stack from logic region 62 as shown in FIGS. 29 and 30.

Following the continuation of the flow chart on FIG. 46B, process 4600 continues with Act 4633, removing pad nitride layer 82 and pad oxide layer 81 from logic region 62 as shown in FIG. 30. Act 4634 is forming a deep well implant in logic region 62 as also shown in FIG. 30.

Act 4635 is forming dummy gate stack 3105 as shown in FIG. 31. Dummy gate stack 3105 may include an oxide layer 3101, a high-K dielectric layer 3102, a dummy gate electrode layer 3103, and a dummy gate hard mask layer 3104. Act 4636 is patterning to remove dummy gate stack 3105 from memory region 25 while defining dummy gates 3203 in logic region 62 as shown in FIG. 32.

Act 4637 is forming sidewall spacers 39 adjacent dummy gates 3203 as shown in FIG. 34. Act 4638 is implanting lightly doped HKMG source/drain regions 63 as also shown in FIG. 34. The number of masks and doping steps is dependent on the desired number of different source/drain doping types and concentrations.

Act 4639 is forming second sidewall spacers 38 as shown in FIG. 35. Act 4640 is removing memory capping layer 2701 from memory region 25 as shown in FIG. 36. Act 4641 is implanting heavily doped memory source/drain regions 26 and heavily doped HKMG source/drain regions 65 as shown in FIG. 37. Again, the number of masks and doping steps is dependent on the desired number of different source/drain doping types and concentrations. Act 4642 is annealing. Annealing repairs damage to substrate 43 caused by the implants and activates the implants. Act 4643 is saliciding to form silicide pads 30 and 67 in memory region 25 and logic region 62 respectively as shown in FIG. 37.

Figure 39:
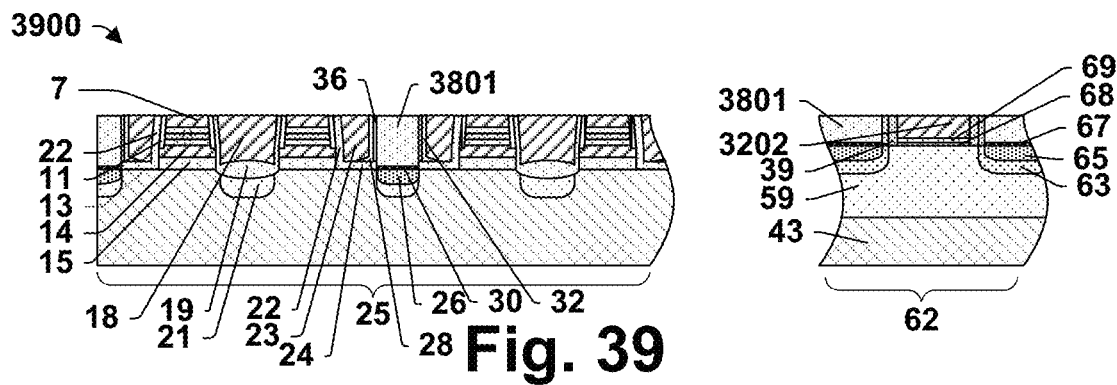

Act 4644 is removing select gate hard masks 2301, control gate hard masks 1201, and erase gate hard masks 2302 from memory region 25. This may be accomplished by depositing second ARC 3801 as show in FIG. 38 and non-selectively etching to recess the resulting surface as shown in FIG. 39. Second ARC 3801 may then be removed as show in FIG. 40.

Act 4645 is depositing a first inter-level dielectric layer, ILD0 layer 29 as shown in FIG. 41. This is followed by Act 4646, exposing dummy gate electrode 3202. This may be accomplished by planarization as shown in FIG. 42. Act 4647 is removing dummy gate electrode 3202 as shown in FIG. 43.

Act 4648 is depositing and/or growing the metal for HKMG gates 70. This is followed by act 4649, CMP to remove excess metal, leaving only the metal that forms metal gate electrodes 57 as shown in FIG. 44.

Act 4650 is saliciding to form silicide pads 9 and 17 on select gate electrodes 23 and erase gate electrodes 18 respectively as shown in FIG. 45. A mask may be used to prevent silicide from forming on control gate electrodes 7.

Act 4651 is forming a first metal interconnect layer including vias 31, metal lines 2, and ILD1 layer 5 as shown in FIG. 1. Act 4652 is additional processing to complete formation of an IC device, including further back-end-of-line (BEOL) processing. It may be appreciated the process 4600 is a replacement gate or gate-last process.

Some aspects of the present teachings relate to an IC that includes a semiconductor substrate having a memory area and a logic area. A plurality of flash memory cells are in the memory area. Each of the flash memory cells includes a floating gate, a control gate, and a select gate. Each of the select gates includes a select gate electrode, a select gate dielectric adjacent the substrate below the select gate electrode, and a select gate spacer on a side of the select gate opposite the floating gate. A plurality of logic gates are formed the logic area. Each of the logic gates includes a logic gate electrode, a logic gate dielectric adjacent the substrate below the logic gate electrode, and logic gate spacers on either side of the logic gate electrode. The composition of the select gate spacer is distinct from the composition of the logic gate spacers.

In some of these teaching, the select gate spacer comprises a first oxide layer grown from the select gate electrode. In some of these teachings, select gate spacer comprises a second oxide layer formed by deposition. In some of these teachings, the select gate dielectric comprises an oxide layer grown from the select gate electrode. In some of these teachings, the select gate dielectric is thicker on a side adjacent the select gate spacer as compared to a side of the select gate dielectric that is distal from the select gate spacer Some aspects of the present teachings relate to an IC that includes a semiconductor substrate having a memory area and a logic area. A memory cell in the memory area includes a select gate separated from a floating gate by a floating gate spacer. A select gate spacer is formed on a side of the select gate opposite the floating gate. The select gate spacer has a uniform thickness over most of the select gate. A logic gate spacer may be formed adjacent a logic gate in the logic area.

In some of these teachings, the logic gate spacer has a composition that is difference from a composition of the select gate spacer. In some of these teachings, the logic gate spacer is thicker than the select gate spacer. In some of these teachings, the logic gate spacer comprises an oxide layer and a nitride layer while the select gate spacer comprises only oxide layers. In some of these teachings, the select gate spacer is substantially vertical. In some of these teachings, there is a select gate dielectric between the select gate and the substrate and the select gate dielectric has a thickness that increases in relation to a distance from the floating gate.

Some aspects of the present teachings relate to a method of forming an IC that includes forming a floating gate stack over a memory region and a logic region of a semiconductor substrate, removing the floating gate stack from the logic region, forming a control gate stack over the floating gate stack in the memory region, pattering to form control gates from the control gate stack, forming control gate sidewall spacers adjacent the control gates, patterning the floating gate stack to form floating gates, forming floating gate sidewall spacers adjacent the floating gates, forming a select gate dielectric layer on the substrate, forming a select gate layer over the select gate dielectric layer, the floating gates, and the control gates, etching the select gate layer to form select gates, and oxidizing the select gates to form a first select gate spacer. In some of these teachings, oxidizing the select gates to form the first select gate spacer increases a thickness of the select gate dielectric layer In some of these teachings, the method further includes covering the memory region with a protective layer after forming the first select gate spacer, forming a logic gate stack, patterning the logic gate stack to form logic gates, which may be dummy gates, forming a spacer layer over the protective layer and the logic gates, etching the spacer layer to form spacers adjacent the logic gates, and removing the protective layer from the memory region.

In some of these teachings the method includes depositing an oxide to form a second select gate spacer over the first select gate spacer prior to depositing the protective layer. In some of these teachings, the second select gate spacer is formed by atomic layer deposition.

In some of these teachings, the method includes depositing a select gate hard mask layer using a conformal deposition process over a mandrel formed in part by the control gates an etching the select gate hard mask layer to form select gate hard masks. In these teachings, etching the select gate layer to form select gates includes etching through the select gate layer in areas adjacent the select gate hard masks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a semiconductor substrate comprising a memory area and a logic area;
a plurality of flash memory cells in the memory area, each of the flash memory cells comprising a floating gate, a control gate, and a select gate, each of the select gates comprising a select gate electrode, a select gate dielectric adjacent the semiconductor substrate below the select gate electrode, and a select gate spacer on a side of the select gate electrode opposite the floating gate; and
a plurality of logic gates in the logic area, each of the logic gates comprising a logic gate electrode and logic gate spacers on either side of the logic gate electrode;
wherein a composition of the select gate spacer is distinct from a composition of the logic gate spacers;
the select gate spacer comprises a first oxide layer grown from the select gate electrode; and
the select gate spacer has a more vertical profile than the logic gate spacers.

2. An IC according to claim 1, wherein the logic gate spacers are thicker than the select gate spacer.

3. An IC according to claim 1, wherein:
the logic gate spacers comprise an oxide layer and a nitride layer; and
the select gate spacer comprises only oxide layers.

4. An IC according to claim 1, wherein:
the select gate spacer further comprises a second oxide layer formed by deposition; and
the first oxide layer is thicker than the second oxide layer.

5. An IC according to claim 1, wherein the select gate dielectric comprises an oxide layer grown from the select gate electrode.

6. An IC according to claim 1, wherein the select gate dielectric is thicker on a side adjacent the select gate spacer as compared to a side of the select gate dielectric that is distal from the select gate spacer.

7. The integrated circuit (IC) of claim 1, wherein the select gate spacer has a profile that is more vertical than a profile of the logic gate spacers.

8. The integrated circuit (IC) of claim 1, wherein the select gate spacer has a uniform thickness over a majority of a height of the select gate electrode.

9. The integrated circuit (IC) of claim 1, wherein the first oxide layer extends directly underneath the select gate electrode.

10. The integrated circuit (IC) of claim 1, wherein the first oxide layer extends directly underneath the select gate electrode.

11. An integrated circuit (IC) comprising:
a semiconductor substrate comprising a memory area and a logic area;
a plurality of flash memory cells in the memory area; and
a plurality of logic gates in the logic area;
wherein each of the flash memory cells comprises a floating gate, a control gate, and a select gate;
each of the select gates comprises a select gate electrode and a select gate dielectric;
a select gate spacer disposed adjacent the select gate electrode is an oxidation product of the select gate electrode;
the oxidation product extends underneath the select gate electrode to provide the select gate dielectric with a variable thickness that is greater adjacent select gate spacer; and
a source/drain region within the semiconductor substrate is doped in alignment with the select gate spacer.

12. The integrated circuit (IC) of claim 11, wherein:
the select gate spacer has a sidewall to which the source/drain region is aligned; and
the sidewall has a profile of the type produced by etching through a mask.

13. An integrated circuit (IC) comprising:
a semiconductor substrate comprising a memory area and a logic area;
a plurality of flash memory cells in the memory area; and
a plurality of logic gates in the logic area;
wherein each of the flash memory cells comprising a floating gate, a control gate, and a select gate;
each of the select gates comprises a select gate electrode and a select gate dielectric;
a select gate spacer structure is disposed adjacent the select gate electrode;
the select gate spacer structure comprises an oxidation product of the select gate electrode;
the oxidation product is thicker than a native oxide layer;
the semiconductor substrate comprises a source-drain region;
the select gate spacer structure has a sidewall to which the source-drain region is aligned; and
the sidewall is vertical through a height of the select gate electrode.

14. The integrated circuit (IC) of claim 13, wherein the select gate spacer structure comprises a distinct layer that has a uniform thickness.

15. The integrated circuit (IC) of claim 13, further comprising:
one or more logic gates spacers adjacent the logic gates;
wherein a thickness of the one or more logic gate spacers is greater than a thickness of the select gate spacer structure.

16. The integrated circuit (IC) of claim 13, wherein the select gate dielectric has a thickness that increases in relation to a distance from the floating gate.

17. The integrated circuit (IC) of claim 13, wherein the oxidation product extends underneath the select gate electrode to provide the select gate dielectric with a variable thickness that is greater adjacent select gate spacer.

18. The integrated circuit (IC) of claim 13, further comprising:
a logic gate spacer in the logic area;
wherein the logic gate spacer comprises a nitride; and
the select gate spacer structure is one or more oxides.

19. The integrated circuit (IC) of claim 13, wherein:
the select gate spacer structure comprises a second oxide layer formed by deposition; and
the oxidation product is thicker than the second oxide layer.

20. The integrated circuit (IC) of claim 13, wherein the oxidation product forms the sidewall.

* * * * *